US008848387B2

(12) United States Patent
Nagata et al.

(10) Patent No.: US 8,848,387 B2
(45) Date of Patent: Sep. 30, 2014

(54) SHIELD CASE, CONNECTOR AND ELECTRONIC EQUIPMENT

(75) Inventors: Takayuki Nagata, Yao (JP); Takahisa Ohtsuji, Yao (JP)

(73) Assignee: Hosiden Corporation, Yao-shi (JP)

( * ) Notice: Subject to any disclaimer, the term of this patent is extended or adjusted under 35 U.S.C. 154(b) by 806 days.

(21) Appl. No.: 13/043,880

(22) Filed: Mar. 9, 2011

(65) Prior Publication Data

US 2011/0235293 A1 Sep. 29, 2011

(30) Foreign Application Priority Data

Mar. 26, 2010 (JP) ................................ 2010-072566
May 20, 2010 (JP) ................................ 2010-116038

(51) Int. Cl.
*H05K 7/10* (2006.01)
*H05K 7/12* (2006.01)

(52) U.S. Cl.
USPC ............ 361/767; 361/785; 361/816; 361/818

(58) Field of Classification Search
USPC ......... 361/816, 818; 439/607.35–607.38, 660
See application file for complete search history.

(56) References Cited

U.S. PATENT DOCUMENTS

| | | | | |
|---|---|---|---|---|
| 5,685,739 A * | 11/1997 | Davis et al. | .............. | 439/607.38 |
| 5,772,453 A | 6/1998 | Tan et al. | | |
| 6,962,510 B1 * | 11/2005 | Chen et al. | .................... | 439/660 |
| 7,097,507 B1 * | 8/2006 | Zhang et al. | ............. | 439/607.35 |
| 2005/0118876 A1 | 6/2005 | Niitsu | | |
| 2007/0149032 A1 | 6/2007 | Saito et al. | | |
| 2009/0142946 A1 | 6/2009 | Lu | | |
| 2009/0149045 A1 | 6/2009 | Chen et al. | | |
| 2010/0062653 A1 | 3/2010 | Mao et al. | | |

FOREIGN PATENT DOCUMENTS

| | | | |
|---|---|---|---|
| EP | 2 120 299 A2 | | 11/2009 |
| JP | 2004-537836 A1 | | 12/2004 |
| JP | 2009-4302 A1 | | 1/2009 |
| JP | 2010-092786 | | 4/2010 |
| WO | WO 03/012928 A1 | | 2/2003 |
| WO | WO 03/028169 A1 | | 4/2003 |
| WO | WO 2009/115922 A2 | | 9/2009 |

OTHER PUBLICATIONS

European Search Report issued on Jul. 20, 2011 for counterpart European patent application No. 11250383.4.
Notification of Reasons for Refusal dated Oct. 15, 2013 issued in counterpart application No. 2010-116038 with English translation.

* cited by examiner

*Primary Examiner* — Tuan T Dinh
(74) *Attorney, Agent, or Firm* — Kratz, Quintos & Hanson, LLP

(57) ABSTRACT

The present invention provides a shield case having electrical conductivity and being mountable on a circuit board. The shield case includes a first surface adapted to be placed on the circuit board and a second surface provided continuously with the first surface and extending at an angle or at a right angle with respect to the first surface. A first recess of generally U-shape is provided in a boundary area of the first surface with the second surface and including first and second end portions. A pair of second recesses is provided in a boundary area of the second surface with the first surface and communicating with the first and second end portions of the first recess. The shield case also includes a pad, being defined by the first and second recesses and connectable by soldering to an electrode of the circuit board.

10 Claims, 19 Drawing Sheets

SHIELD CASE, CONNECTOR AND ELECTRONIC EQUIPMENT

The present application claims priority under 35 U.S.C. §119 of Japanese Patent Application Nos. 2010-072566 filed on Mar. 26, 2010 and 2010-116038 filed on May 20, 2010, the disclosures of which are expressly incorporated by reference herein in their entity.

BACKGROUND OF THE INVENTION

1. Technical Field

The present invention relates to shield cases mountable on circuit boards and also relates to connectors and electronic equipment with the same shield cases.

2. Background Art

A conventional connector of this type has a shield case configured to increase peel strength between a circuit board and itself. More particularly, the shield case has a pair of connecting terminals, formed by cutting and downwardly bending portions of side plates of the shield case, and projections, projecting from the bottom plate of the shield case. The connecting terminals are connected by soldering to through-hole electrodes of a circuit board. The projections are connected by soldering to electrodes on the circuit board (see Patent Literature 1).

CITATION LIST

Patent Literature 1: Japanese Unexamined Patent Publication No. 2009-4302

SUMMARY OF INVENTION

A problem with the above conventional connector is that the existence of the projections causes a clearance produced between the bottom plate and the circuit board. Solder melted during soldering work tends to spread through the clearance to the entire area of the bottom plate, disabling the formation of large solder fillets and deteriorating peel strength between the circuit board and the bottom plate. The clearance produced between the bottom plate and the circuit board due to the projections causes a further problem of increased mounting height of the connector.

The present invention has been devised in view of the above-described situation. The invention provides a shield case of a reduced mounting height, with no clearance and improved peel strength between a circuit board and itself. The invention also provides a connector and electronic equipment installed with the same shield case.

The present invention provides a shield case having electrical conductivity and being mountable on a circuit board. The shield case includes a first surface adapted to be placed on the circuit board and a second surface provided continuously with the first surface and extending at an angle or at a right angle with respect to the first surface. A first recess of generally U-shape is provided in a boundary area of the first surface with the second surface and including first and second end portions. A pair of second recesses is provided in a boundary area of the second surface with the first surface and communicating with the first and second end portions of the first recess. The shield case also includes a pad, being defined by the first and second recesses and connectable by soldering to an electrode of the circuit board.

In the above-described shield case, no clearance is produced between the first surface and the circuit board when the first surface is placed on the circuit board. This is because the first and second recesses are formed in the first and second surfaces, respectively; the portion defined by the first and second recesses in the first and second surfaces functions as the pad for connection by soldering with the electrode of the circuit board; and therefore the portion of the pad provided in the first surface is flush with the first surface. Further, the portion of the pad provided in the first surface is surrounded by the first recess, which minimizes unfavorable spread of solder into other areas of the first surface. Still further, as the second surface extends at an angle or at a right angle with respect to the first surface, it should be appreciated that the portion of the pad provided in the second surface also extends at an angle or at a right angle with respect to the portion of the pad provided in the first surface. Applying the solder to the portion of the pad provided in the second surface should yield a large solder fillet, improving the peel strength of the shield case with respect to the circuit board. The nonexistence of clearance between the first surface and the circuit board is also favorable in reducing the mounting height of the shield case. As the pad is surrounded by the first and second recesses, no openings are formed in the boundary area between the first and second surface, unlike a case where connection terminals are formed by cutting and downwardly bending portions of the shield case. The nonexistence of openings is also advantageous in minimizing intrusion of solder and flux into the shield case through the boundary area between the first and second surface during soldering connection process and in securing favorable prying resistance of the shield case As the pad being a portion surrounded by the first and second recesses, the pad should not affect the outer size of the shield case, and the shield case of the invention is advantageous in minimizing the mounting space for the shield case on the circuit board.

The shield case may further include a partition to partition an internal space of the shield case into first and second slots. If the shield case includes a bottom plate, the partition may include a central portion of the bottom plate bent inside the shield case, and a depressed surface formed on the back of the partition. The first surface may be an outer surface of the bottom plate and the second surface may be the depressed surface of the partition.

In this aspect of the shield case, as the pad is provided in at least one of the boundary areas between the outer surface of the bottom plate and the depression of the partition, solder connection of the pad to the electrode of the circuit board contributes to the improved peel strength between a central portion of the shield case and the circuit board.

If the bottom plate has first and second ends in a first direction, the shield case may further include first and second side plates, provided upright at the first and second ends, respectively; and first and second connecting terminals, provided in the first and second side plates and adapted for connection with surface electrodes or through-hole electrodes of the circuit board.

The shield case may include a bottom plate, including first and second ends in a first direction; and first and second side plates, provided upright at the first and second ends respectively of the bottom plate. In this case, the first surface may be an outer surface of the bottom plate and the second surface may include outer surfaces of the first and second side plates.

In this aspect of the shield case, a set of the first and second recesses and the pad is provided in the boundary area between the outer surface of the bottom plate and the outer surface of the first side plate, and another set of the first and second recesses and the pad is provided in the boundary area between the outer surface of the bottom plate and the outer surface of the second side plate. As such, solder connection of the pad to the electrode of the circuit board contributes to the improved peel strength between end portions of the shield case and the circuit board.

If the first and second side plates each include first and second ends in a second direction perpendicular to the first direction, the shield case may further include first and second folded-back portions, provided at the first ends of the first and second side plates and folded back toward the second ends thereof; first and second outer walls, provided at the first and second folded-back portions to extend along the outer surfaces of the first and second side plates; and first and second connecting terminals, provided at the first and second outer walls and connectable to surface electrodes or through-hole electrodes of the circuit board.

In this aspect of the shield case, as the first and second connecting terminals are provided in the first and second outer walls, no openings are formed in the bottom plate or the first and second side plates, unlike the case where the connecting terminals are formed by cutting and downwardly bending portions of the bottom plate or the first and second side wall portions. This aspect of the invention can minimize intrusion of solder and flux into the shield case through such openings and secure favorable prying resistance of the shield case The shield case may further include a coupling portion configured to couple the first outer wall and the second outer wall. In this case, the coupling portion coupling between the first and second outer walls can improve the prying strength of the shield case.

A connector of the invention includes the above-described shield case, a body having an insulating property and being adapted to be received in the shield case, and a contact provided in the body.

Electronic equipment of the invention includes the above-described connector and the circuit board adapted to mount the connector thereon. The pad of the shield case of the connector includes a first pad portion, provided in the first surface of the shield case, and a second pad portion, provided in the second surface of the shield case and extending at an angle or at a right angle with respect to the first pad portion. The circuit board includes the electrode being contactable with the first pad portion and extending to a side of the second pad portion.

BRIEF DESCRIPTION OF DRAWINGS

FIG. 1A illustrates the connector as seen from the front, plan and right side, and FIG. 1B illustrates the connector as seen from the back, plan and right side.

FIG. 2A is a front view, FIG. 2B is a back view, FIG. 2C is a plan view, FIG. 2D is a bottom view, FIG. 2E is a right side view, and FIG. 2F is a left side view.

FIG. 7A illustrates an integrated plug connector, FIG. 7B illustrates a single plug connector to be connected to a first slot of the connector, and FIG. 7C illustrates a single plug connector to be connected to a second slot of the connector.

FIG. 8A illustrates the connector as seen from the front, plan and right side, and FIG. 8B illustrates the connector as seen from the back, plan and right side.

FIG. 9A is a front view, FIG. 9B is a back view, FIG. 9C is a plan view, FIG. 9D is a bottom view, FIG. 9E is a right side view, and FIG. 9F is a left side view.

FIG. 100 is a cross-sectional view of the connector taken along 10C-10C in FIG. 9A.

FIG. 13A is a view of the connector as seen from the front, plan and right side, and FIG. 13B is a view of the connector as seen from the front, bottom and right side.

FIG. 14A is a front view, FIG. 14B is a back view, FIG. 14C is a plan view, and FIG. 14D is a bottom view.

FIG. 15A is a side view, and FIG. 15B is a cross-sectional view taken along 15B-15B in FIG. 14A.

DESCRIPTION OF EMBODIMENTS

Figure 1A:
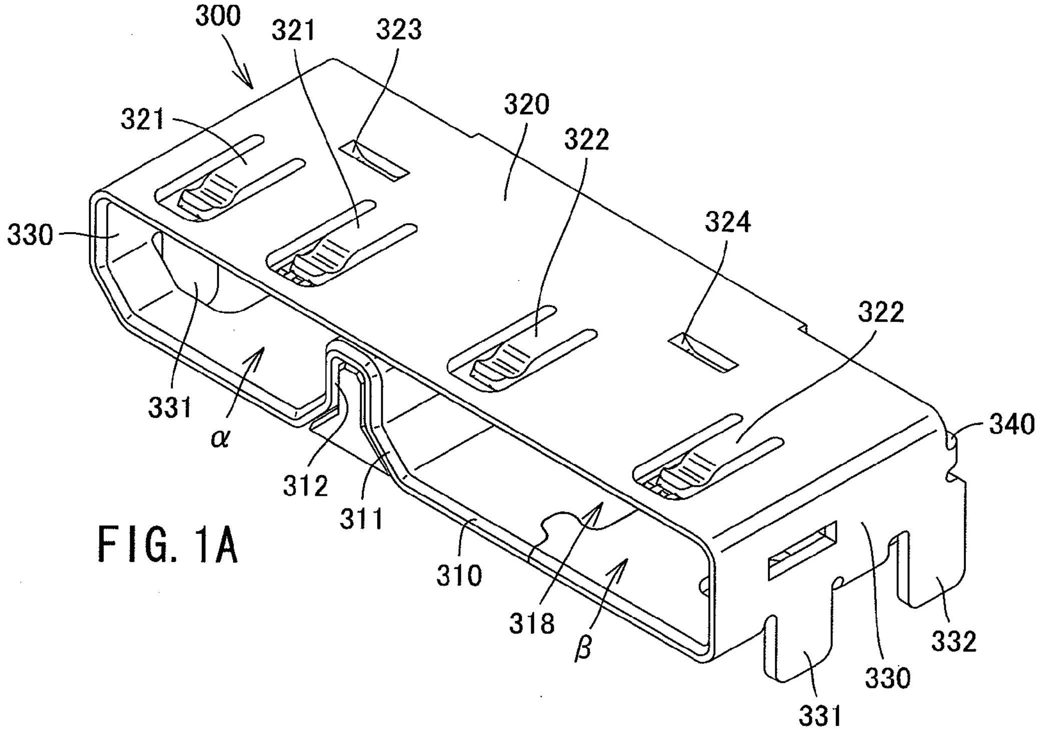
FIGS. 1A and 1B are schematic perspective views of a connector according to a first embodiment of the present invention, where

First to third embodiments of the present invention will be described below.

First Embodiment

First, a receptacle connector according to a first embodiment of the present invention will be described with reference to FIGS. 1A to 7C. The receptacle connector shown in FIGS. 1A to 3D is compliant with HDMI (High-Definition Multimedia Interface, registered trademark) standard. It is adapted to be mounted on a circuit board 10 of electronic equipment such as a television receiver and used as an external interface of the electronic equipment. The receptacle connector includes first and second bodies 100_a_, 100_b_, a plurality of first, second, third, fourth contacts 200_a_, 200_b_, 200_c_, 200_d_, and a shield case 300. These respective elements will be described in detail below. For convenience of explanation, FIGS. 4 and 5 indicate an insertion direction γ (second direction) and a width direction δ (first direction). The insertion direction γ is the direction to insert the first and second bodies 100*a*, 100*b* into an accommodating space (to be described) of the shield case 300. The with direction δ is the width direction of the shield case 300 and the orthogonal direction to the insertion direction γ.

The shield case 300 is fabricated by press-molding a electrically conductive metal plate into a generally rectangular tuboid shape, as shown in FIGS. 1A to 5. The shield case 300 has a bottom plate 310, a top plate 320, a pair of side plates 330 (first and second side plates), and a pair of lock pieces 340. The bottom plate 310 is a generally rectangular plate opposed to the top plate 320. An outer surface (a first surface) of the bottom plate 310 is adapted to be placed on the circuit board 10. The side plates 330 are provided upright at ends in the width direction δ (first and second ends in the first direction) of the bottom plate 310. Upper ends of the side plates 330 are coupled by the top plate 320. The depth (length in the insertion direction γ) of the bottom plate 310 is shorter than each depth of the top plate 320 and the side plates 330, as shown in FIGS. 3A to 3D. The bottom plate 310, and a front portion of the top plate 320, and front portions of the side plates 330 define an internal space of the shield case 300, and rear portions of the top plate 320 and the side plates 330 define the accommodating space for accommodating the first and second bodies 100*a*, 100*b* inserted from a rear side.

Figure 2A:
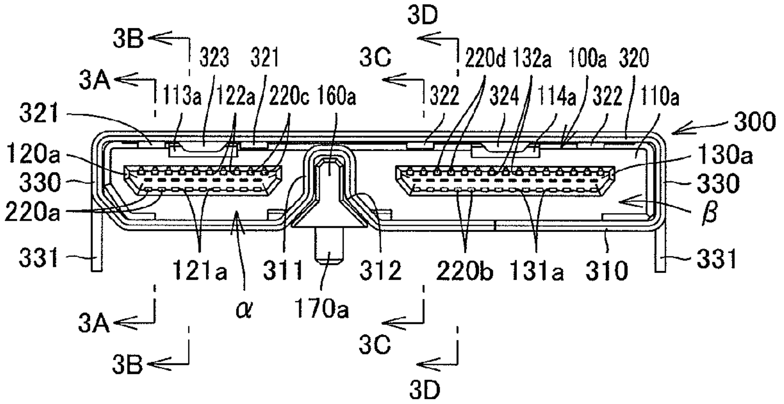
FIGS. 2A to 2F are schematic views of the connector, where
Figure 2B:
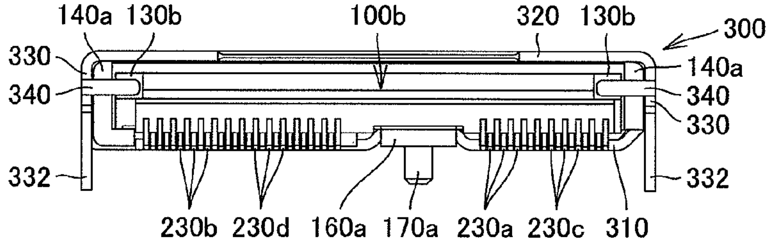
Figure 2C:
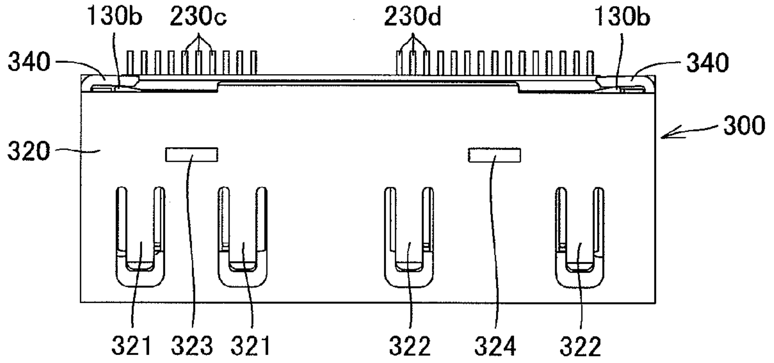
Figure 2D:
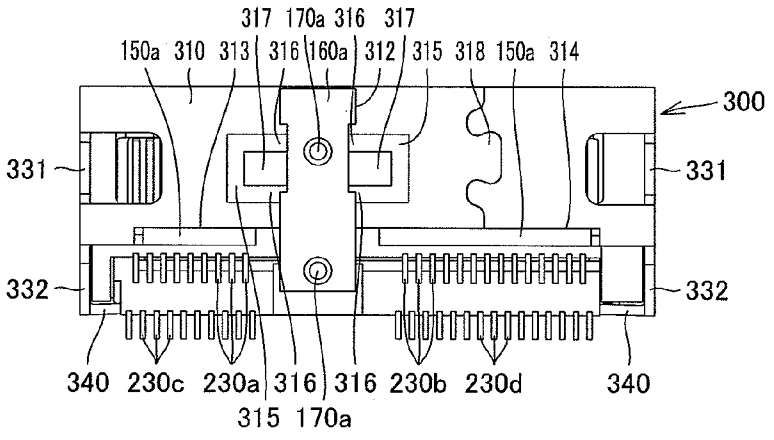
Figure 2E:
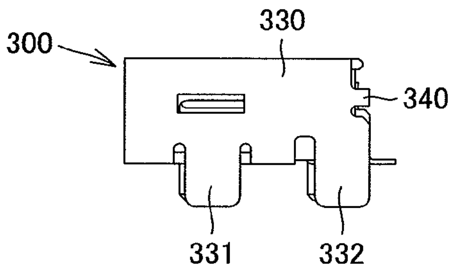
Figure 2F:
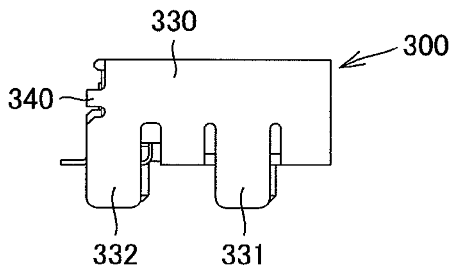
Figure 5:
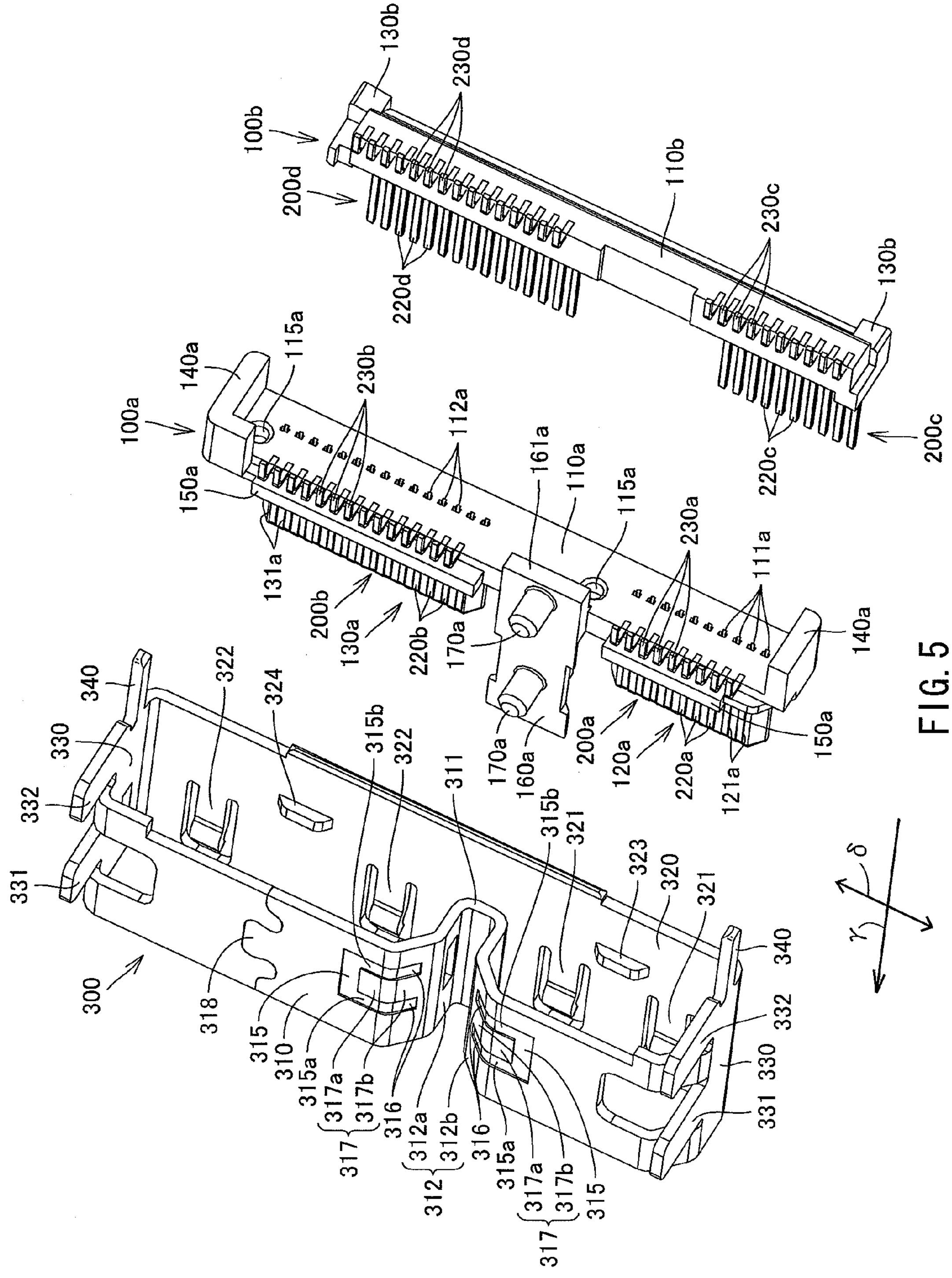
FIG. 5 is an exploded perspective view of the connector as seen from the back, bottom and left side.
Figure 6:
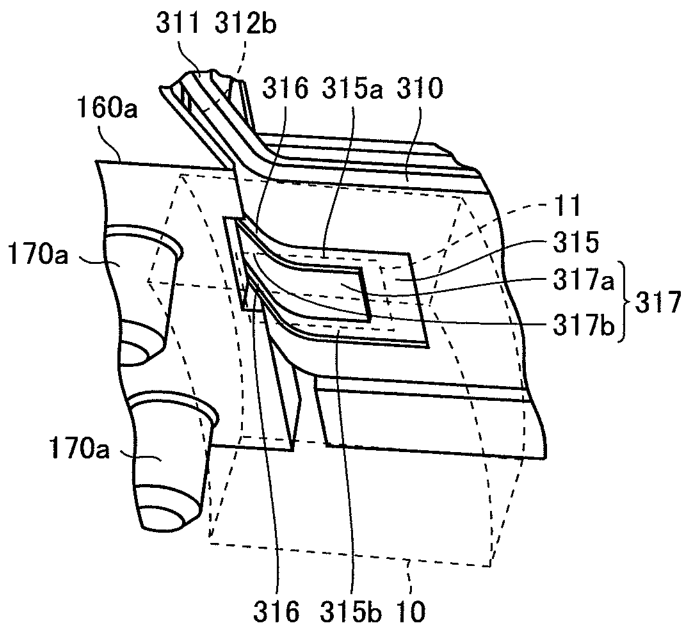
FIG. 6 is an explanatory view showing a state where a pad of a shield case of the connector is connected by soldering to an electrode of a circuit board.

As shown in FIGS. 1A and 2A, the bottom plate 310 is bent at its central portion into a generally inverted U shape extending toward the top plate 320. The bent central portion serves as a partition 311 to partition the internal space of the shield case 300 into first and second slots α, β. The back side of the partition 311 forms a depression 312 (depressed surface of the partition) having a generally inverted U-shaped cross section. The partition 311 and the depression 312 extend the entire depth of the bottom plate 310, i.e. from the front end (first end) to the rear end (second end) in the insertion direction γ of the bottom plate 310, as shown in FIG. 5. The depression 312 consists of a rectangular upper depression 312*a* and a lower depression 312*b*. The distance between the opposite walls of the lower depression 312*b* are gradually increased toward the lower end, such that the inner surfaces (second surface) of the lower depression 312*b* are inclined (i.e. extends at an angle) with respect to the outer surface of the bottom plate 310. In boundary areas of the outer surface of the bottom plate 310 with the inner surfaces of the lower depression 312*b*, there are formed generally U-shaped first recesses 315, each of which has first and second end portions 315*a*, 315*b*, as shown in FIGS. 5 and 6. The first recesses 315 of U-shape have mouths opening inward, i.e. toward the depression 312. In each of boundary areas of the inner surfaces of the lower depression 312*b* with the outer surface of the bottom plate 310, there is formed a pair of rectangular second recesses 316, communicating with the first and second end portions 315*a*, 315*b* of the first recess 315. Areas defined by the first and second recesses 315, 316 serve as pads 317 for connection by soldering with a pair of ground electrodes 11 of the circuit board 10. The pads 317 each have first and second pad portions 317*a*, 317*b*. The first pad portions 317*a* are provided in the outer surface of the bottom plate 310. The surfaces of the first pad portions 317*a* are located at the same height as (i.e. flush with) the outer surface of the bottom plate 310. The second pad portions 317*b* are provided in the inner surfaces of the lower depression 312*b* and inclined with respect to the first pad portions 317*a*. The surfaces of the second pad portions 317*b* are located at the same height as (i.e. flush with) the inner surfaces of the lower depression 312*b*. The ground electrodes 11 are generally rectangular surface electrodes, each having a contactable portion contactable to the first pad portion 317*a* and an extended portion extended from the contactable portion toward the second pad portion 317*b* side.

Figure 3A:
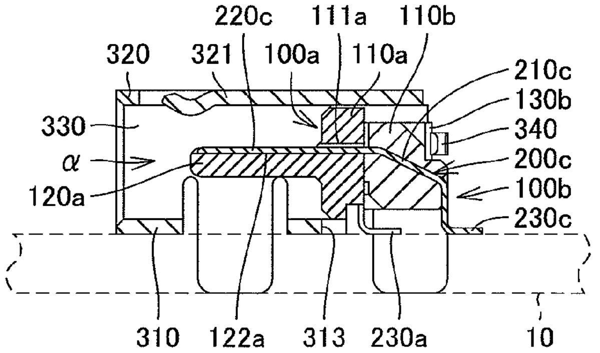
FIG. 3A is a cross-sectional view of the connector taken along 3A-3A in FIG. 2A.
Figure 3B:
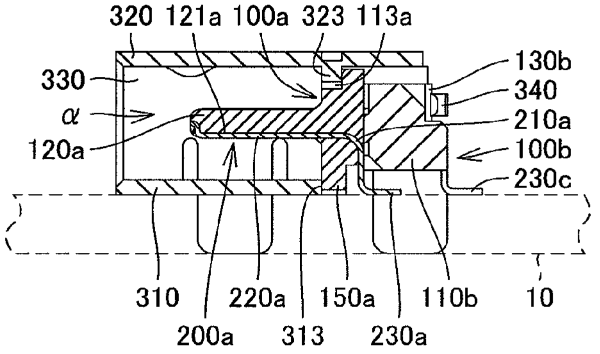
FIG. 3B is a cross-sectional view of the connector taken along 3B-3B in FIG. 2A.
Figure 3C:
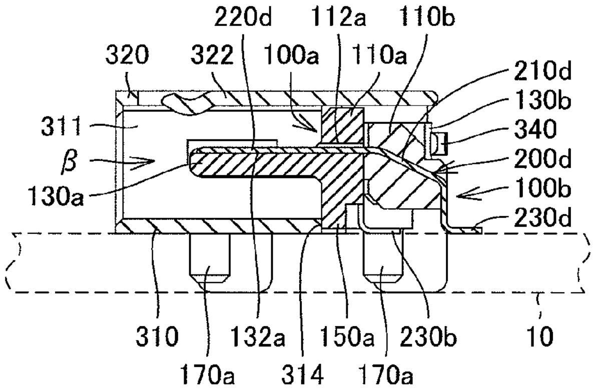
FIG. 3C is a cross-sectional view of the connector taken along 3C-3C in FIG. 2A.
Figure 3D:
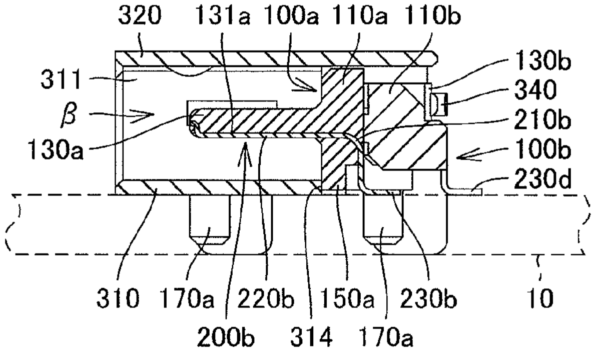
FIG. 3D is a cross-sectional view of the connector taken along 3D-3D in FIG. 2A.
Figure 7A:
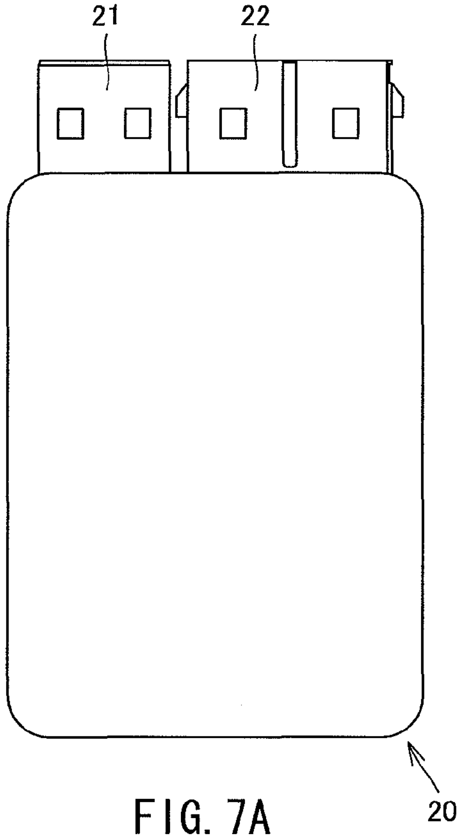
FIGS. 7A to 7C are plan views of plug connectors to be connected to the present connector, where
Figure 7B:
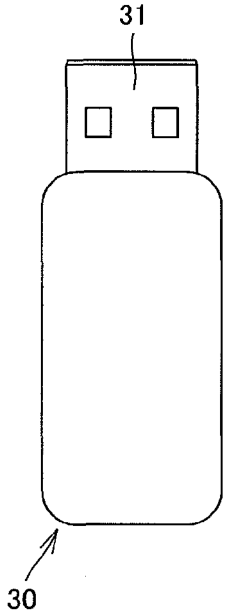
Figure 7C:
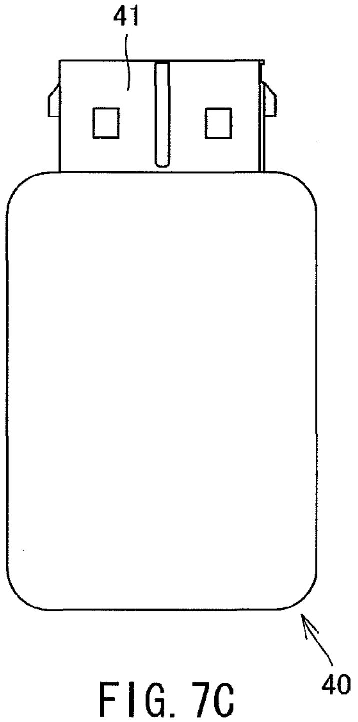
Figure 8A:
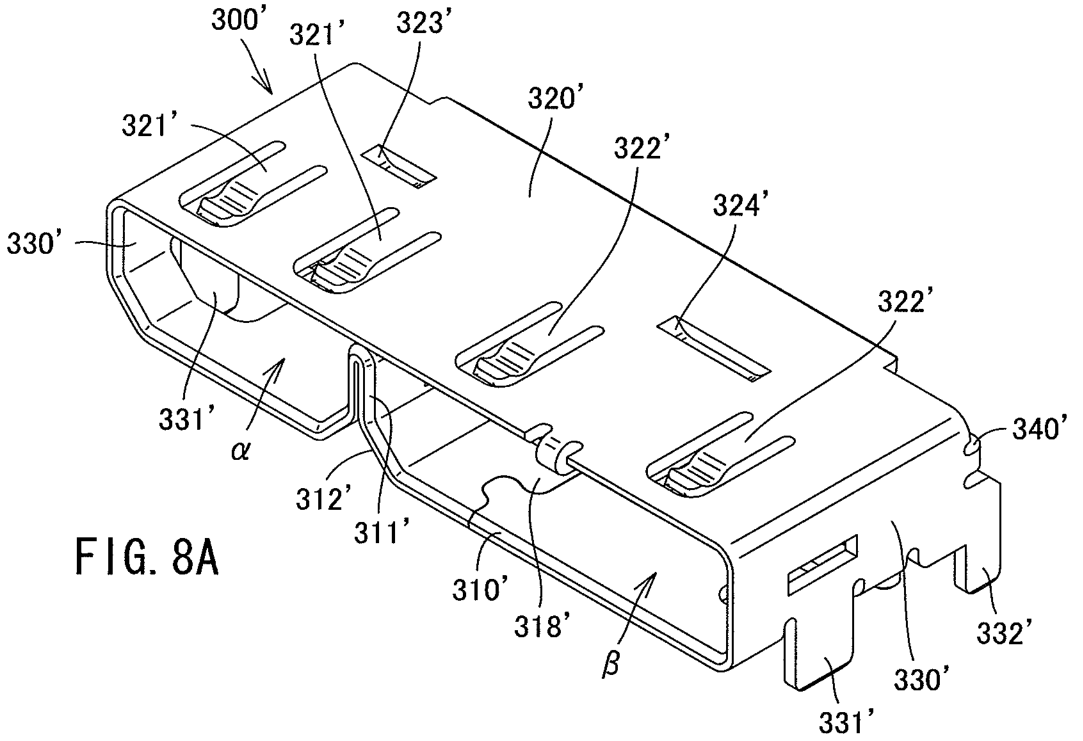
FIGS. 8A and 8B are schematic perspective views of a connector according to a second embodiment of the present invention, where
Figure 8B:
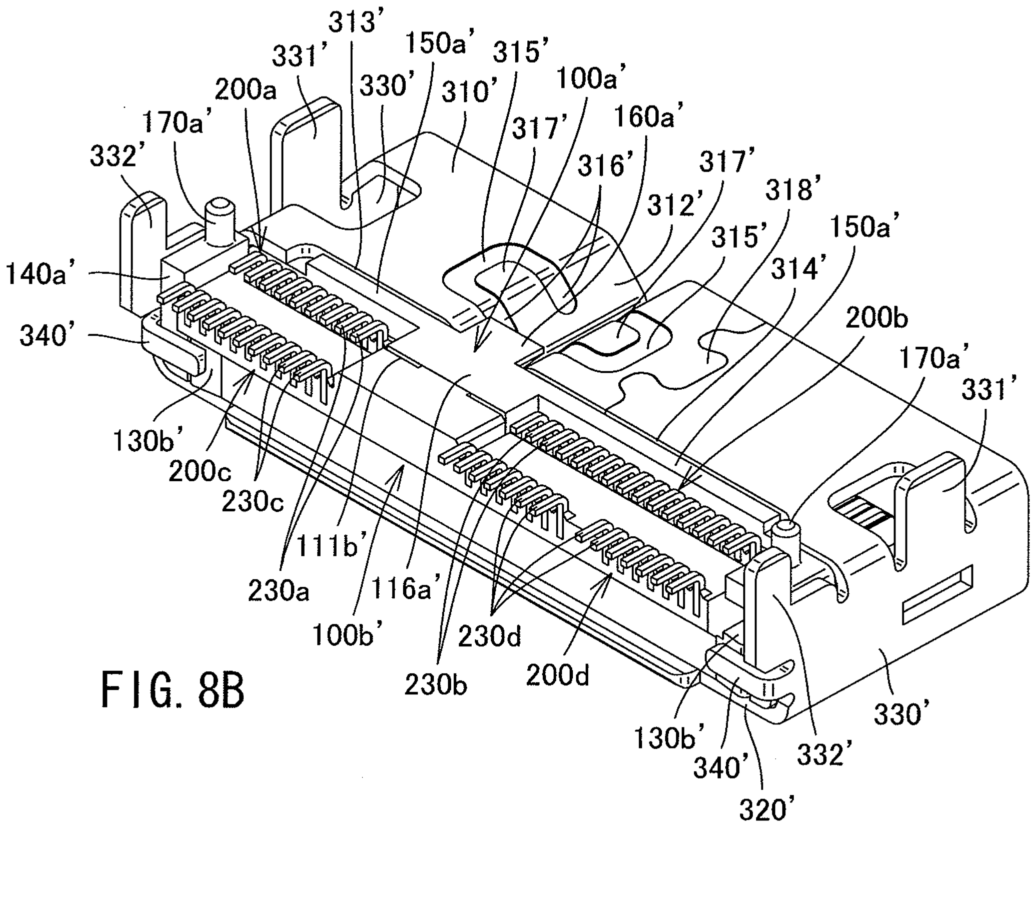
Figure 9A:
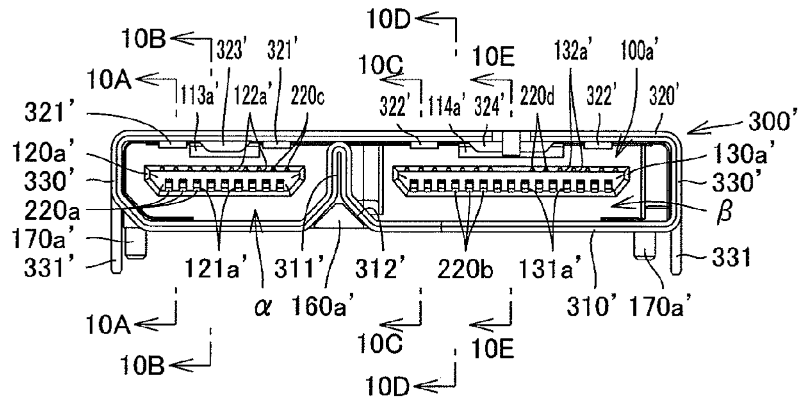
FIGS. 9A to 9F are schematic views of the connector, where
Figure 9B:
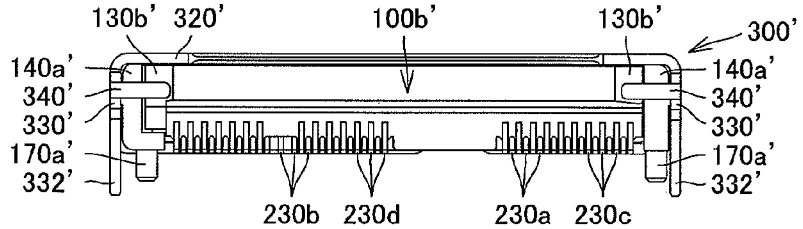
Figure 9C:
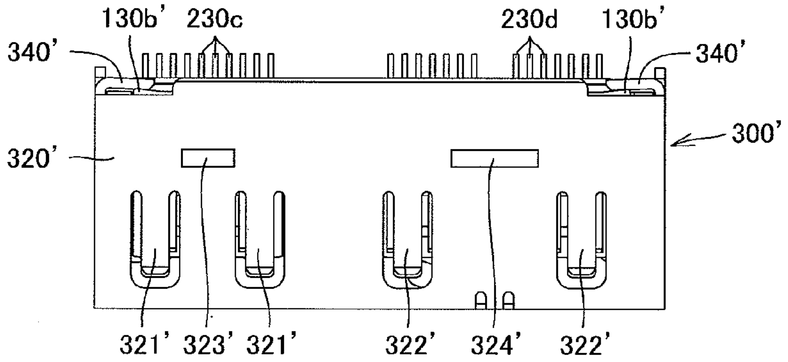
Figure 9D:
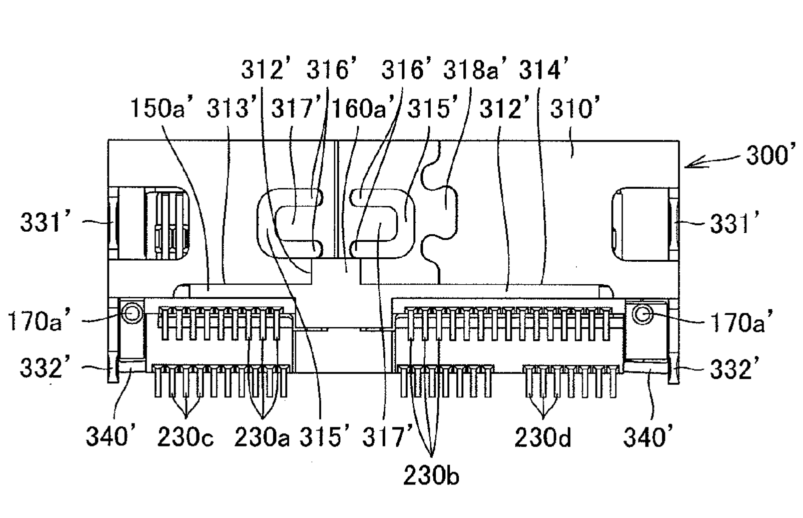
Figure 9E:
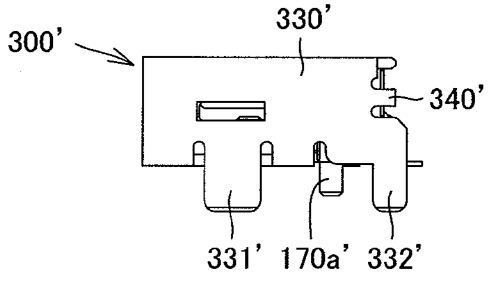
Figure 9F:
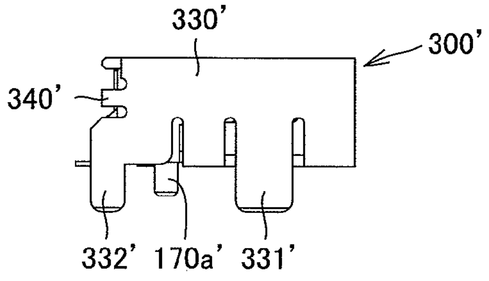

The bottom plate 310 has a joining portion 318 on the second slot β side. The joining portion 318 is a portion where end portions of a metal plate forming the shield case 300 are joined and swaged. Providing the joining portion of the shield case 300 on the second slot β side portion of the bottom plate 310 makes it possible to secure favorable strength of the first and second slot α, β portions of the shield case 300. The first slot α has an inner shape conforming to an outer shape of a connection portion 21 for HDMI-mini of a plug connector 20 as shown in FIG. 7A or of a connection portion 31 for the HDMI-mini of a plug connector 30 as shown in FIG. 7B. The second slot β has an inner shape conforming to an outer shape of a connection portion 22 for HDMI of the plug connector 20 as shown in FIG. 7A or of a connection portion 41 for HDMI of a plug connector 40 as shown in FIG. 7C. That is, the first slot α is adapted to receive the connection part 21 or the connection part 31, and the second slot β is adapted to receive the connection part 22 or the connection part 41. Moreover, rear surfaces of the bottom plate 310, corresponding to first and second slot α and β, serve as abutting-stop surfaces 313, 314 to abut front surfaces of a pair of elongated protrusions 150*a* (to be described) of the first body 100*a*, as shown in FIGS. 3B to 3D.

Figure 1B:
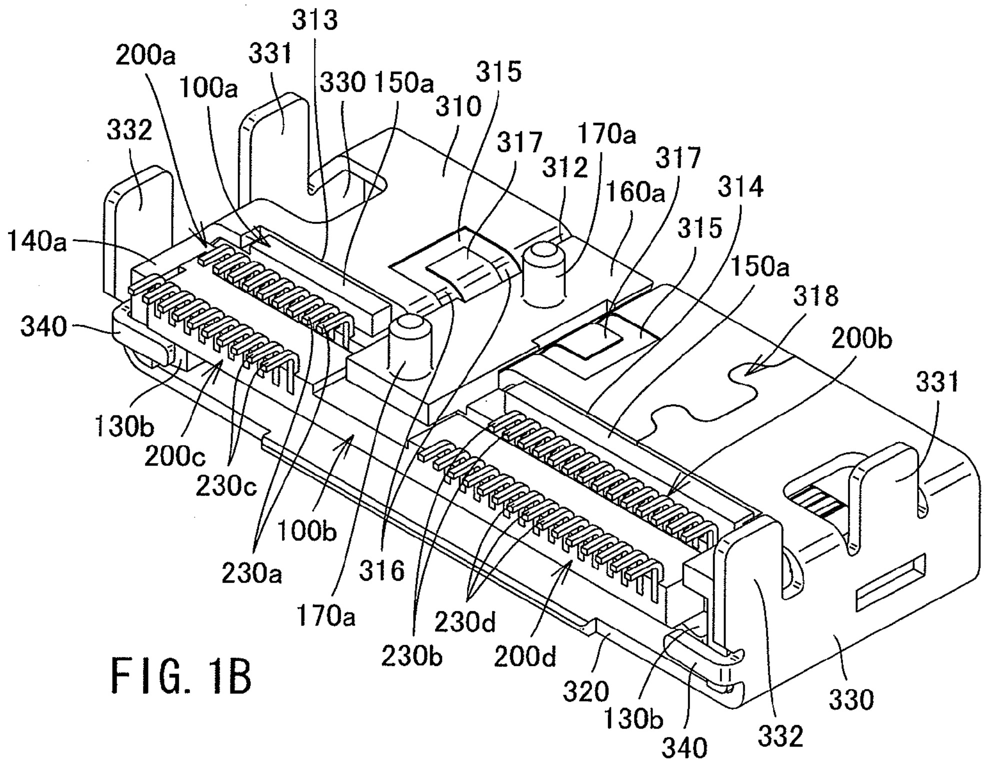

The top plate 320 is a generally rectangular plate portion as shown in FIGS. 1A and 1B. The top plate 320 are cut at portions to form two locking pieces 321 and two locking pieces 322. Distal ends of the locking pieces 321, 322 are bent downward into circular arcs. When inserting a plug connector 20 or 30 into the first slot α, its connection part 21 or 31 is elastically contacted and held by the distal ends of the locking pieces 321. Similarly, when inserting a plug connector 20 or 40 into the second slot β, its connection part 21 or 41 is elastically contacted and held by the distal ends of the locking pieces 322. Moreover, the top plate 320 are partially cut at portions posterior to the locking pieces 321, 322 and depressed downward to form abutting-stops 323, 324.

A lower end of each of the side plates 330 is provided with a front terminal 331 (first/second connecting terminal) and a rear terminal 332 (first/second connecting terminal) extended downward. The front terminals 331 are cut pieces extending downward, formed by partly cutting opposite widthwise end portions of the bottom plate 310 and bending these cut parts downward. The rear terminals 332 are formed by cutting and bending downward portions of a cut-away area of the bottom plate 310, which portions are reserved before cutting away the cut-away area to make the depth dimension of the bottom plate 310 smaller than the top plate 320 and the side plates 330. The front terminals 331 and the rear terminals 332 are to be inserted into through-hole electrodes (not shown) of the circuit board 10. The lock pieces 340 are extended from rear ends of the side plates 330.

The first body 100*a* is an injection-molded article of insulating resin. The first body 100*a* has a main body 110*a*, first and second projected portions 120*a*, 130*a*, a pair of guides 140*a*, the pair of elongated protrusions 150*a*, a reinforcing member 160*a*, and a pair of locking projections 170*a*, as shown in FIGS. 3A to 5. The main body 110*a* is a plate having a rectangular cross-section. The main body 110*a* has a plurality of first and second holes 111*a*, 112*a* formed in the insertion direction γ through the main body 110*a* and arranged at spaced intervals in a row along the width of the first body 100*a*. As shown in FIGS. 3A to 3D and FIG. 4, cutaways 113*a*, 114*a* are provided in an upper end portion of a front surface in the insertion direction γ of the main body 110*a*. The cutaways 113*a*, 114*a* are adapted to receive the abutting-stops 323, 324 of the shield case 300, so that the abutting-stops 323, 324 abut back surfaces of the cutaways 113*a*, 114*a* from the front side.

The front surface in the insertion direction γ of the main body 110*a* is provided with the plate-like first and second projected portions 120*a*, 130*a* to be inserted into the first and second slots α, β. The first and second projected portions 120*a*, 130*a* have such outer shapes as to fit in connection holes (not shown) of the connection parts 21, 22 of the plug connector 20 shown in FIG. 7A. The lower surfaces of the first, second projected portions 120*a*, 130*a* has a plurality of first and second long grooves 121*a*, 131*a* at spaced intervals in a row in the width direction δ. The upper surfaces of the first and second projected portions 120*a*, 130*a* has a plurality of third and fourth long grooves 122*a*, 132*a* at spaced intervals in a row in the width direction δ, in communication with the first and second holes 111*a*, 112*a*, respectively. The first, second, third and fourth long grooves 121*a*, 131*a*, 122*a*, 132*a* extend in the insertion direction γ. Each of the third long grooves 122*a* is located in plan position between adjacent first long grooves 121*a*. Each of the fourth long grooves 132*a* is located in plan position between adjacent second long grooves 131*a*. In other words, as shown in FIG. 2A, the first long grooves 121*a* and the third long grooves 122*a* are arranged in a zigzag manner, and the second long grooves 131*a* and the fourth long grooves 132*a* are arranged in a zigzag manner.

Figure 4:
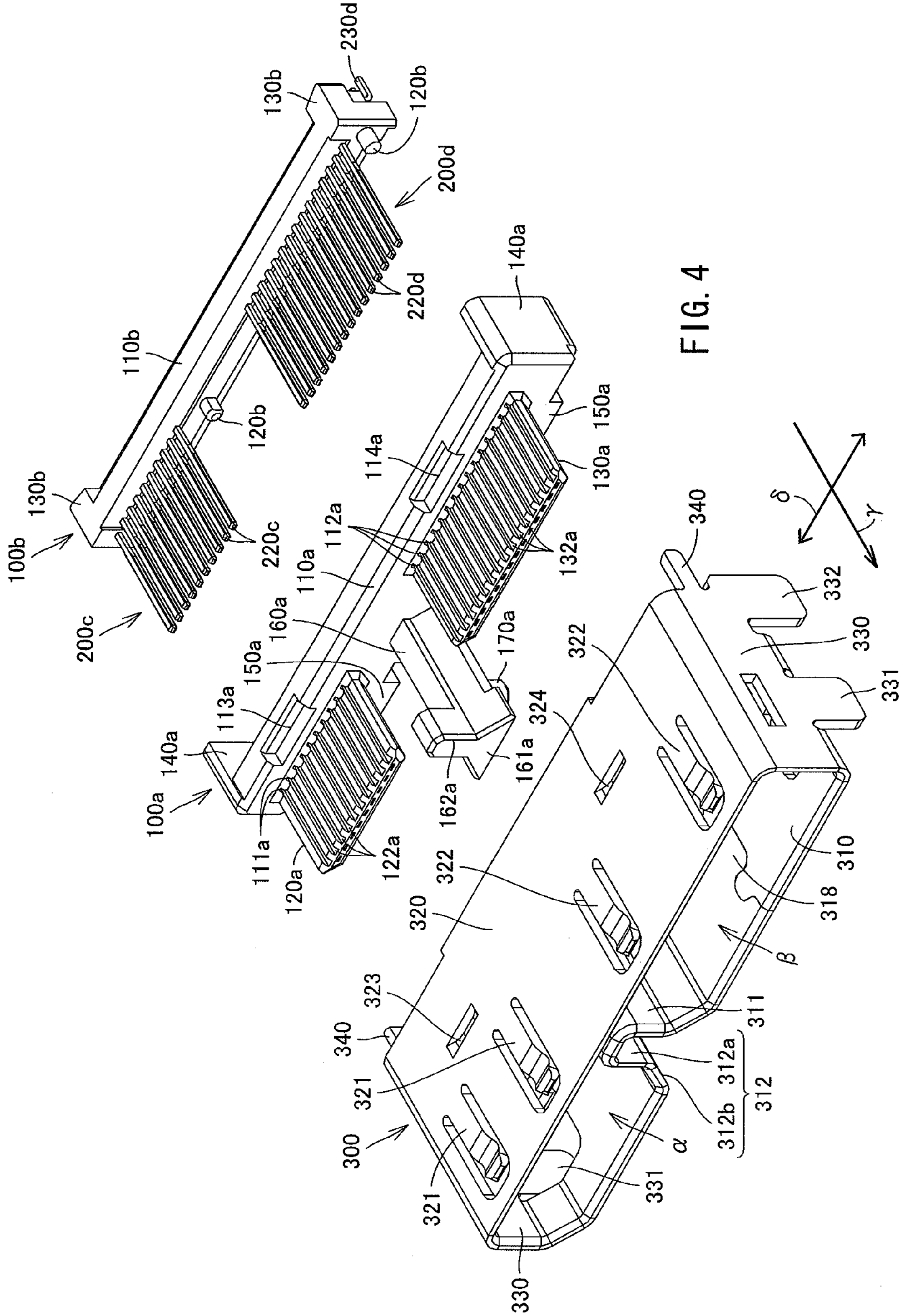
FIG. 4 is an exploded perspective view of the connector as seen from the front, plan and right side.

The reinforcing member 160*a* of generally L-shape is provided centrally at a lower end of the front surface of the main body 110*a*, as shown in FIG. 4. The reinforcing member 160*a* has an arm 161*a* of generally triangular prism shape and a projection 162*a* of rectangular prism shape. The arm 161*a* is a generally triangular prism extending forward from the front of the main body 110*a*. The projection 162*a* is a rectangular prism projecting upward from the distal end of the arm 161*a*. The projection 162*a* fits in the upper depression 312*a* of the depression 312 of the shield case 300, and the arm 161*a* fits in the lower depression 312*b* of the depression 312. The reinforcing member 160*a* thus fits in a part of the depression 312 of the shield case 300. The pair of columnar locking projections 170*a* is provided on the lower surface of the arm 161*a*. The locking projections 170*a* are to be inserted into locking holes (not shown) of the circuit board 10.

As shown in FIG. 5, in the main body 110*a*, the plurality of first and second contacts 200*a*, 200*b* are arrayed at spaced intervals in a row in the width direction δ. Each of the first contacts 200*a* is a conductive elongated metal plate as shown in FIG. 3B and has an embedded portion 210*a*, a contact portion 220*a* and a tail portion 230*a*. The embedded portion 210*a* is a generally inverted L-shaped and embedded in the main body 110*a*, and a rear end portion thereof projects downward from the main body 110*a*. The contact portion 220*a* extends straight continuously from a distal end of the embedded portion 210*a* and is received in one of the first long grooves 121*a* of the first projected portion 120*a*. The tail portion 230*a* is a flat plate continuing to a rear end of the embedded portion 210*a* and bent at a right angle with respect to the rear end portion of the embedded portion 210*a*. Each of the second contacts 200*b* is a conductive elongated metal plate as shown in FIG. 3D and has an embedded portion 210*b*, a contact portion 220*b*, and a tail portion 230*b*. The second contacts 200*b* have the same configuration as the first contacts 200*a*, except that the contact portions 220*b* are to be received in the second long grooves 131*a* of the second projected portion 130*a*. As such, the respective portions of the second contacts 200*b* will not be further described with regard to overlap with the first contacts 200*a*.

The pair of elongated protrusions 150*a* is provided on the lower surface of main body 110*a*. The elongated protrusions 150*a* are adapted to abut the abutting-stop surfaces 313, 314 of the bottom plate 310 of the shield case 300 from the front side. The pair of guides 140*a* is provided at the widthwise ends of a rear surface in the insertion direction γ of the main body 110*a*. The top surfaces of the guides 140*a* are adapted to abut the top plate 320 of the shield case 300, improving the degree of parallelism of the combined first and second bodies 100*a* and 100*b* in relation to the top plate 320 of the shield case 300. As shown in FIG. 5, the rear surface of the main body 110*a* has fitting holes 115*a*, one between the first and second holes 111*a* and 112*a* and the other outside the second holes 112*a*.

The second body 100*b* is an injection-molded article of insulating resin, as shown in FIGS. 3A to 5. The second body 100*b* has a main body 110*b*, a pair of fitting projections 120*b*, and a pair of hills 130*b*. The main body 110*b* has a generally L-shaped cross-section, and its width is a little smaller than a distance between the guides 140*a* of the first body 100*a*. When the second body 100*b* is inserted between the guides 140*a* of the first body 100*a*, the first and second bodies 100*a*, 100*b* are combined anteroposteriorly in the insertion direction γ. As shown in FIG. 4, the front surface in the insertion direction γ of the main body 110*b* has the pair of fitting projections 120*b* at corresponding positions to the fitting holes 115*a*. The fitting projections 120*b* are columnar projections to fit in the fitting holes 115*a* of the first body 100*a*. The fit between the fitting projections 120*b* and the fitting holes 115*a* allows the first and second bodies 100*a*, 100*b* to be maintained in a combined state. The pair of hills 130*b* is provided at widthwise ends of a rear surface in the insertion direction γ of the main body 110*b*. The hills 130*b* have enough height for their tips to project rearward from the guides 140*a* of the first body 100*a* with the first and second bodies 100*a*, 100*b* combined. The tips of the hills 130 abut the lock pieces 340 of the shield case 300 bent into generally L shapes. As a result, the first and second bodies 100*a*, 100*b* accommodated in the accommodating space of the shield case 300 are securely sandwiched between the lock pieces 340 and front abutting portions (namely, the partition 311 and the abutting-stop surfaces 313, 314 of the bottom plate 310, and the abutting-stops 323, 324 of the top plate 320). The first and second bodies 100*a*, 100*b* are thus fixed inside the accommodating space. It is appreciated that FIGS. 4 and 5 illustrates the lock pieces 340 in a straightened state before bent.

In the main body 110*b*, as shown in FIG. 4, the plurality of third and fourth contacts 200*c*, 200*d* are arrayed in a row in the width direction δ and at the same spaced intervals as those of the first and second holes 111*a*, 112*a*, respectively. The third and fourth contacts 200*c*, 200*d* are located above the first and second contacts 200*a*, 200*b* (i.e., at a different height position). Each of the third contacts 200*c* is a conductive elongated metal plate as shown in FIG. 3A and has an embedded portion 210*c*, a contact portion 220*c*, and a tail portion 230*c*. The embedded portion 210*c* is embedded in the main body 110*b* and has an obliquely inclined intermediate portion, and a distal portion bent with respect to the intermediate portion, and a rear portion bent with respect to the intermediate portion and extended downward. The distal portion and the intermediate portion of the embedded portion 210*c* are embedded in the main body 110*b*. The rear end portion of the embedded portion 210*c* projects downward from the main body 110*b*. The contact portion 220*c* is a flat plate continuing to the distal end of the embedded portion 210*c* and projecting from the front surface of the main body 110_b_. The contact portion 220_c_ is longer than the first contact portion 220_a_ by a thickness of the main body 110_a_ of the first body 100_a_. The contact portion 220_c_ is to be received in one of the first holes 111_a_ and one of the third long grooves 122_a_ of the first body 100_a_. The tail portion 230_c_ is a flat plate continuing to a rear end of the embedded portion 210_c_ and bent at a right angle with respect to the rear end of the embedded portion 210_c_. Each of the fourth contacts 200_d_ is a conductive elongated metal plate as shown in FIG. 3C and has an embedded portion 210_d_, a contact portion 220_d_, and a tail portion 230_d_. The fourth contacts 200_d_ have the same configuration as the third contacts 200_c_, except that the contact portions 220_d_ are to be received in the second holes 112_a_ of the first body 100_a_ and in the fourth long groove 132_a_ of the second projection 130_a_. As such, the respective portions of the fourth contacts 200_d_ will not be further described with regard to overlap with the third contacts 200_c_.

The contact portions 220_a_ received in the first long grooves 121_a_ and the contact portions 220_c_ received in the third long grooves 122_a_ are arranged in a zigzag manner. In other words, each of the contact portions 220_c_ of the third contacts 200_c_ is at a plan position between adjacent ones of contact portions 220_a_ of the first contacts 200_a_. The contact portions 220_a_, 220_c_ thus arranged are inserted into the first slot α together with the first projected portion 120_a_, in a contactable manner with lower and upper contacts of the connection part 21 or 31 of a plug connector or 30 inserted into the first slot α. Similarly, the contact portions 220_b_ received in the second long grooves 131_a_ and the contact portions 220_d_ received in the fourth long grooves 132_a_ are arranged in a zigzag manner. In other words, each of the contact portions 220_d_ of the fourth contacts 200_d_ is at a plan position between adjacent ones of the contact portions 220_b_ of the second contacts 200_b_. The contact portions 220_b_, 220_d_ thus arranged are inserted into the second slot β together with the second projected portion 130_a_, in a contactable manner with lower and upper contacts of the connection part 22 or 41 of a plug connector 20 or 40 inserted into the second slot β. Moreover, lower surfaces of the tail portions 230_a_, 230_c_ are located at the same height, and the tail portions 230_a_, 230_c_ are arrayed in two anteroposterior rows in the insertion direction γ. Also, lower surfaces of the tail portions 230_b_, 230_d_ are located at the same height, and the tail portions 230_b_, 230_d_ are arrayed in two anteroposterior rows in the insertion direction γ. The tail portions 230_a_, 230_b_, 230_c_, 230_d_ are connectable by soldering to associated surface electrodes (not shown) of the circuit board 10.

The receptacle connector having the above-described configuration may be assembled in the following steps. First, as shown in FIGS. 4 and 5, the embedded portions 210_a_, 210_b_ of the first and second contacts 200_a_, 200_b_ are embedded in the first body 100_a_ by insert molding, and the embedded portions 210_c_, 210_d_ of the third and fourth contacts 200_c_, 200_d_ are embedded in the second body 100_b_ by insert molding. The embedded first and second contacts 200_a_, 200_b_ will be arrayed in a row in the width direction δ in the first body 100_a_, and the embedded third and fourth contacts 200_c_, 200_d_ will be arrayed in a row in the width direction δ in the second body 100_b_. Simultaneously, the contact portions 220_a_, 220_b_ of the first and second contacts 200_a_, 200_b_ are inserted into the first and second long grooves 121_a_, 131_a_, respectively, of the first body 100_a_.

Thereafter, the first and second bodies 100_a_, 100_b_ are brought relatively closer to each other, and the contact portions 220_c_, 220_d_ of the third and fourth contacts 200_c_, 200_d_ of the second body 100_b_ are inserted into the first and second holes 111_a_, 112_a_ and the third and fourth long grooves 122_a_, 132_a_ of the first body 100_a_. As a result, the contact portions 220_a_ and the contact portions 220_c_ are arranged at the different height positions in a zigzag manner, and the contact portions 220_b_ and the contact portions 220_d_ are arranged at the different height positions in a zigzag manner. Simultaneously, the second body 100_b_ is inserted between the pair of guides 140_a_ of the first body 100_a_, using the guides 140_a_ of the first body 100_a_ to guide the widthwise ends of the second body 100_b_. The fitting projections 120_b_ of the second body 100_b_ are fitted in the fitting holes 115_a_ of the first body 100_a_. Consequently, the first and second bodies 100_a_, 100_b_ are combined anteroposteriorly in the insertion direction γ, so that the tail portions 230_a_, 230_c_ are arranged at the same height in two anteroposterior rows in the insertion direction γ, and the tail portions 230_b_, 230_d_ are arranged at the same height in two anteroposterior rows in the insertion direction γ.

Thereafter, the reinforcing member 160_a_ of the first body 100_a_ is inserted into the depression 312 of the shield case 300, to fit the projection 161_a_ of the reinforcing member 160_a_ in the upper depression 312_a_ of the depression 312 and the arm 162_a_ thereof in the lower depression 312_b_. During this insertion, the reinforcing member 160_a_ is guided by the depression 312 along the insertion direction γ, and the first and second bodies 100_a_, 100_b_ are received between the lock pieces 340 as straightened along the side plates 330. The first and second bodies 100_a_, 100_b_ are inserted along the insertion direction γ, from the rear side into the accommodating space of the shield case 300, while the widthwise ends of the first body 100_a_ are guided by the lock pieces 340, and the first and second projected portions 120_a_, 130_a_ of the first body 100_a_ are inserted into the first and second slots α, β of the shield case 300. Consequently, the front surface of the main body 110_a_ of the first body 100_a_ abuts the partition 311; the elongated protrusions 150_a_ of the first body 100_a_ abut the respective abutting-stop surfaces 313, 314 of the bottom plate 310 of the shield case 300; and the abutting-stops 323, 324 of the top plate 320 of the shield case 300 are received into the cutaways 113_a_, 114_a_ of the first body 100_a_ and abut the back surfaces of the cutaways 113_a_, 114_a_. The guides 140_a_ of the first body 100_a_ abut the top plate 320 of the shield case 300.

In this state, the lock pieces 340 are bent inward to abut the respective hills 130_b_ of the second body 100_b_. Consequently, the first and second bodies 100_a_, 100_b_ are securely sandwiched between the lock pieces 340 and the front abutting portions, so that the first and second bodies 100_a_, 100_b_ are fixedly accommodated in the accommodating space of the shield case 300.

The receptacle connector may be thus assembled and may be mounted on the circuit board 10 in the following manner. First, the front terminals 331 and the rear terminals 332 of the shield case 300 are inserted into the through-holes of the circuit board 10. Simultaneously, the locking projections 170_a_ of the first body 100_a_ are inserted into and locked against the locking holes of the circuit board 10. Consequently, the outer surface of the bottom plate 310 of the shield case 300 is placed on the circuit board 10, so that the pads 317 of the shield case 300 come into contact with the pair of ground electrodes 11 of the circuit board 10, and the tail portions 230_a_, 230_b_, 230_c_, 230_d_ are placed on the surface electrodes of the circuit board 10. Thereafter, the front terminals 331 and the rear terminals 332 are soldered to the through-hole electrodes of the circuit board 10, the pads 317 are soldered to the pair of ground electrodes 11, and the tail portions 230_a_, 230_b_, 230_c_, 230_d_ are soldered to the surface electrodes of the circuit board 10. Solder fillets are thus formed between the second pad portions 317_b_ of the pads 317 and the ground electrodes 11. The shield case 300 is electrically connected to a ground line of the circuit board 10 through the through-hole electrodes and the ground electrodes 11 of the circuit board 10, so that the shield case 300 is able to function as a shield.

In the above-described receptacle connector, no clearance is produced between the outer surface of the bottom plate 310 and the circuit board 10 when the outer surface of the bottom plate 310 is placed on the circuit board 10. This is because the first recesses 315 are formed in the outer surface of the bottom plate 310 of the shield case 300; the second recesses 316 are formed in the opposite inner surfaces of the lower depression 312*b* of the depression 312 on the back side of the partition 311; the portions defined by the first and second recesses 315, 316 function as the pads 317; and the first pad portions 317*a* of the pads 317 are flush with the outer surface of the bottom plate 310. Further, as the first pad portions 317*a* are surrounded by the substantially U-shaped first recesses 315, which minimizes unfavorable spread of solder into other areas of the outer surface of the bottom plate 310 facing the circuit board 10 during soldering work, and which minimizes intrusion of solder into the shield case 300 through the joining portion 318 of the bottom plate 310. The second pad portions 317*b* of the pads 317 are inclined with respect to the first pad portions 317*a*, allowing to form large solder fillets by applying solder to the second pad portions 317*b*. The present connector thus has an improved peel strength between its central portion and the circuit board. The present connector thus has an improved peel strength also between its end portions and the circuit board because the front terminals 331 and the rear terminals 332 of the shield case 300 are connected by soldering to the through-hole electrodes of the circuit board 10. In summary, the present receptacle connector as a whole has such a configuration as to provide high peel strength from the circuit board.

Moreover, the nonexistence of clearance between the outer surface of the bottom plate 310 and the circuit board 10 is also favorable in reducing the mounting height of the receptacle connector. Furthermore, as the pads 317 are surrounded by the first and second recesses 315, 316, no openings are formed in the central portion of the outer surface of the bottom plate 310 or in the inner surfaces of the lower depression 312*b* of the depression 312 on the back side of the partition 311, unlike a case where connection terminals are formed by cutting and downwardly bending portions of the shield case. The nonexistence of openings can thus minimize intrusion of solder and flux into the shield case 300 through the central portion or the partition 311 of the bottom plate 310 during soldering connection process. The nonexistence of openings in the central portion or the partition 311 of the bottom plate 310 is also advantageous in securing favorable prying resistance of the shield case 300. Still advantageously, no connecting terminals are formed in the central portion of the outer surface of the bottom plate 310 or in the inner surfaces of the lower depression 312*b* of the depression 312 on the back side of the partition 311, so that the outer shape of the connector can be minimized for the connecting terminals.

Further advantageously, the reinforcement member 160*a* is partially fitted in the depression 312 on the back side of the partition 311 of the shield case 300. If prying force is applied on the connector by the connection portion 31 of the plug connector 30 inserted into the slot α or by the connection portion 41 of the plug connector 40 inserted into the slot β, it is unlikely that the partition 311 and its surrounding area deform and that the joining portion 318 gets disjoined and released open. Therefore, the connector advantageously has improved prying resistance.

Second Embodiment

Next, a second embodiment of the present invention will be described with reference to FIGS. 7A to 12. Similarly to the receptacle connector of the first embodiment, the receptacle connector shown in FIGS. 8A to 9F is compliant with HDMI (High-Definition Multimedia Interface, registered trademark) standard. It is adapted to be mounted on the circuit board 10 of electronic equipment, such as a television receiver, and used as an external interface of the electronic equipment. This receptacle connector is substantially the same as the receptacle connector of the first embodiment, except that first and second bodies 100*a*' and 100*b*' and a shield case 300' have different shapes from those of the first and second bodies 100*a*, 100*b* and of the shield case 300, respectively. Descriptions made hereinafter focus on the differences, not on overlapping features. It is to be noted that elements of the first and second bodies and the shield case are introduced with reference numerals added with an apostrophe (') to distinguish them from the elements of the first and second bodies and the shield case of the first embodiment. For convenience of explanation, FIGS. 11 and 12 indicate an insertion direction γ (second direction) and a width direction δ (first direction). The insertion direction γ is the direction to insert the first and second bodies 100*a*', 100*b*' into an accommodating space (to be described) of the shield case 300'. The with direction δ is the width direction of the shield case 300' and the orthogonal direction to the insertion direction γ.

Figure 10A:
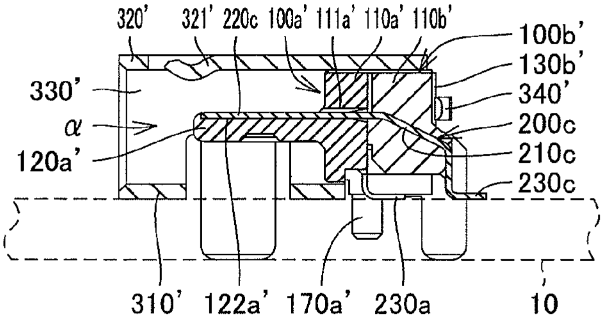
FIG. 10A is a cross-sectional view of the connector taken along 10A-10A in FIG. 9A.
Figure 10B:
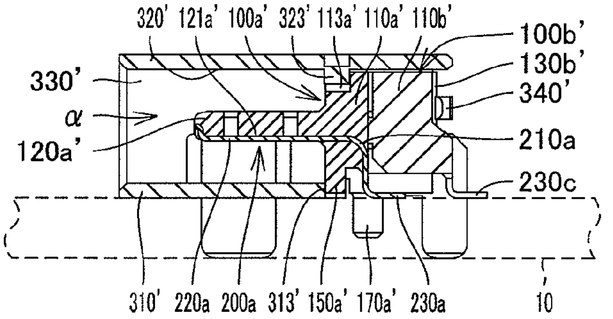
FIG. 10B is a cross-sectional view of the connector taken along 10B-10B in FIG. 9A.
Figure 10C:
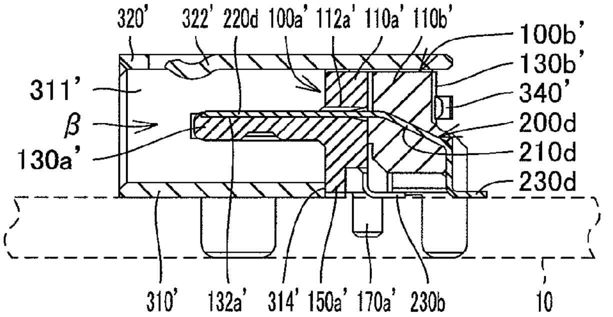
FIG. 10D is a cross-sectional view of the connector taken along 10D-10D in FIG. 9A.
FIG. 10E is a cross-sectional view of the connector taken along 10E-10E in FIG. 9A.
Figure 10D:
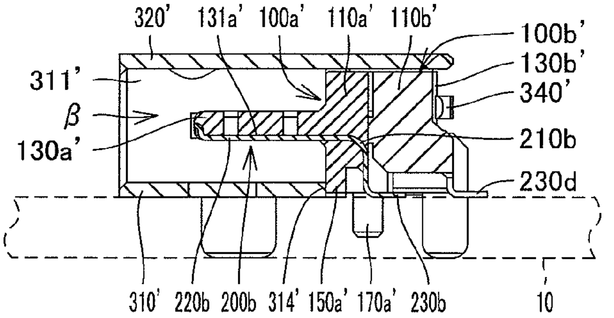
Figure 10E:
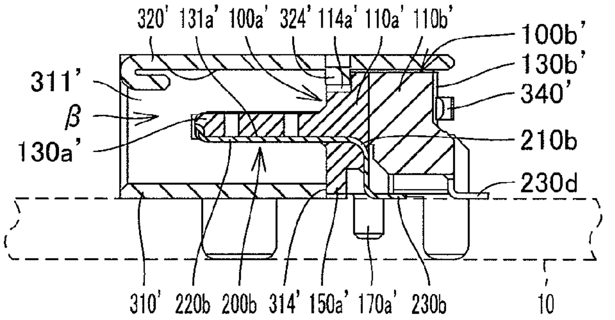
Figure 11:
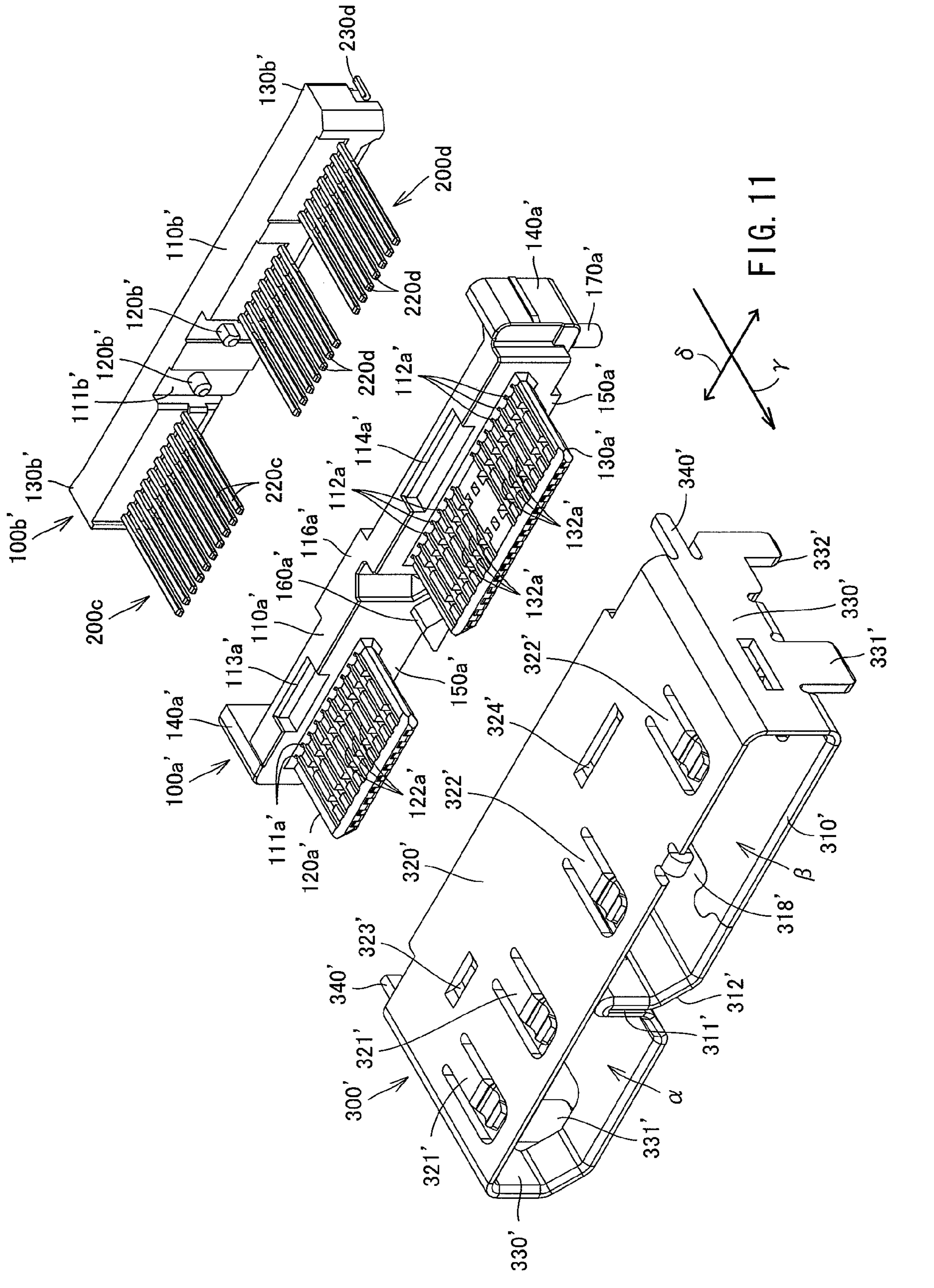
FIG. 11 is an exploded perspective view of the connector as seen from the front, plan and right side.
Figure 12:
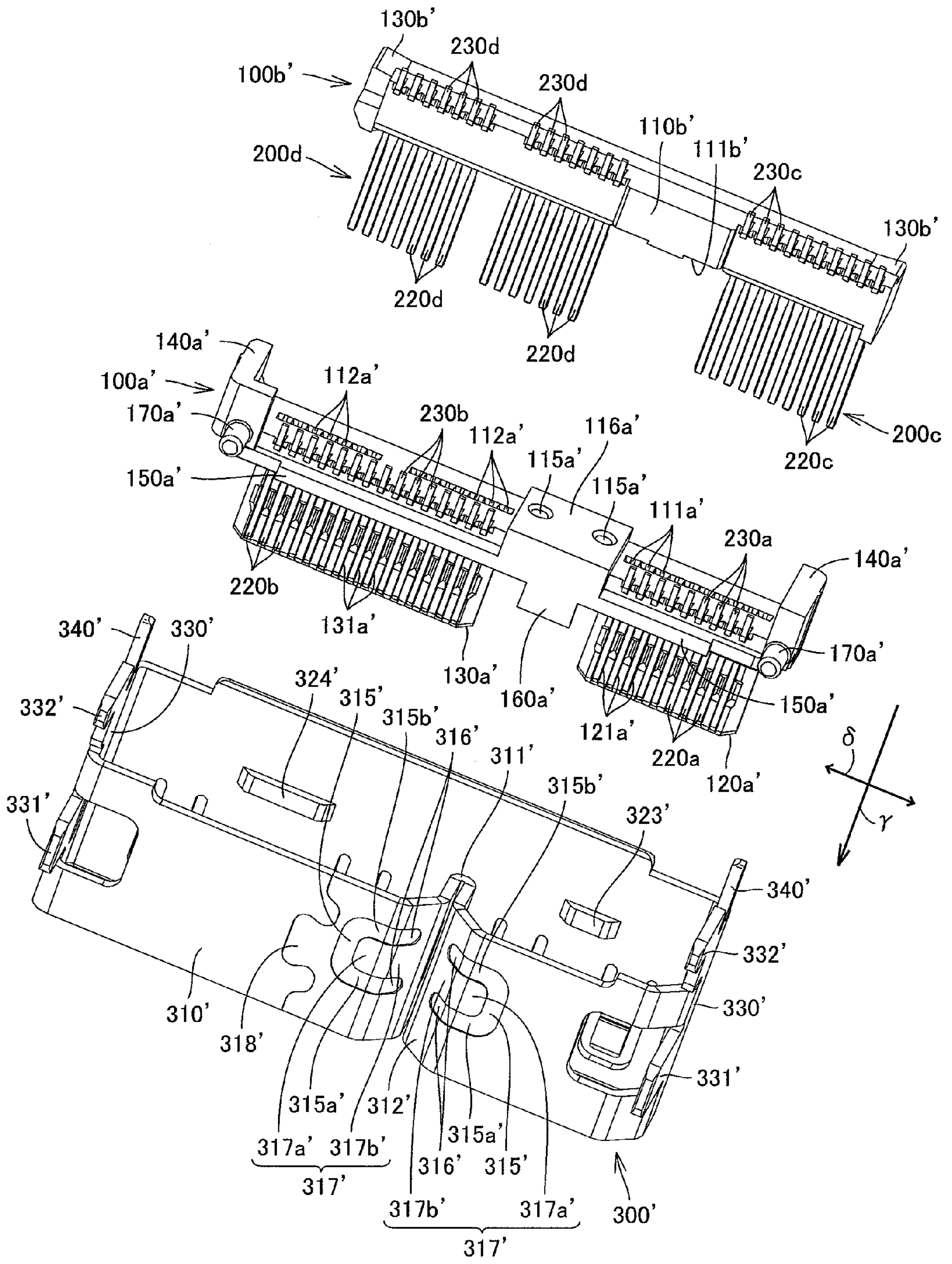
FIG. 12 is an exploded perspective view of the connector as seen from the back, bottom and left side.

The shield case 300' is different from the shield case 300 of the first embodiment in shapes of a partition 311' and a depression 312' of a bottom plate 310'. Descriptions made hereinafter focus on the differences. As shown in FIGS. 8A to 12, the bottom plate 310' is bent at a central portion thereof into an inverted Y shape. This bent portion serves as the partition 311' having an inverted Y-shaped cross section, which partitions an internal space of the shield case 300' into the first and second slots α, β. The back side of the partition 311' forms the depression 312' (depressed surface of the partition) having a substantially triangular cross section. The partition 311' and the depression 312' extend the entire depth of the bottom plate 310, i.e. from the front end (first end) to the rear end (second end) in the insertion direction γ of the bottom plate 310, as shown in FIG. 12. Both inner surfaces (second surface) of the depression 312' are inclined with respect to an outer surface (first surface) of the bottom plate 310'. In boundary areas of the outer surface of the bottom plate 310' with the inner surfaces of the depression 312', there are formed generally U-shaped first recesses 315', each of which has first and second end portions 315*a*', 315*b*'. The first recesses 315' of U-shape have mouths opening inward, i.e. toward the depression 312'. In each of boundary areas of the inner surfaces of the depression 312' with the outer surface of the bottom plate 310', there is formed a pair of rectangular second recesses 316', communicating with the first and second end portions 315*a*', 315*b*' of the first recesses 315'. Areas defined by the first and second recesses 315', 316' serve as pads 317' for connection by soldering with the pair of ground electrodes 11 of the circuit board 10. The pads 317' each have first and second pad portions 317*a*', 317*b*'. The first pad portions 317*a*' are provided in the outer surface of the bottom plate 310'. The surfaces of the first pad portions 317*a*' are located at the same height as (i.e. flush with) the outer surface of the bottom plate 310'. The second pad portions 317*b*' are provided in the inner surfaces of the depression 312' and inclined with respect to the first pad portions 317*a*'. The surfaces of the second pad portions 317*b*' are located at the same height as (i.e. flush with) the inner surfaces of the depression 312'. FIGS. 8A to 12 also illustrate a joining portion 318', a top plate 320', side plates 330', lock pieces 340', locking pieces 321' and 322', abutting-stops 323' and 324', front terminals 331', and rear terminals 332'.

The first body **100*a*' is different from the first body 100*a* of the first embodiment in arrays of second holes 112' of a main body 110*a*' and fourth long grooves 132' of a second projected portion 130*a*', positions of fitting holes 115*a*' of the main body 110*a*', a newly provided fitting projection 116*a*' in the main body 110*a*', a shape of a reinforcing member 160*a*', and positions of a pair of locking projections 170*a*'. Descriptions made hereinafter focus on the differences. As shown in FIGS. 11 and 12, the main body 110*a*' has the second holes 112*a*' arrayed at spaced intervals with a wider interval in the middle of the array, and the second projected portion 130*a*' has the fourth long grooves 132*a*' at spaced intervals with a wider interval in the middle of the array. Accordingly, the same wider interval is provided in the middle of the row of the fourth contacts 200*d*, embedded portions 210*d* of which are embedded with the wider interval in the main body 110*b*' of the second body 100*b*'. The reinforcing member 160*a*' is a generally triangular prismatic arm projecting from a front surface of the main body 110*a*'. The length of the reinforcing member 160*a*' is smaller than the length in the insertion direction γ of the depression 312', i.e., the reinforcing member 160*a*' fits in a part of the depression 312'. The locking projections 170*a*' project from lower surfaces of a pair of guides 140*a*'. The locking projections 170*a*' are to be received and locked in the locking holes (not shown) of the circuit board 10. The fitting projection 116*a*' is a rectangular parallelepiped projection projected in the center of a rear end surface of the main body 110*a*'. The pair of fitting holes 115*a*' is formed in a rear surface of the fitting projection 116*a*'. FIGS. 9A to 12 also illustrate a first projected portion 120*a*', elongated protrusions 150*a*', first holes 111*a*', cutaways 113*a*' and 114*a*', first long grooves 121*a*', second long grooves 122*a*', and third long grooves 131*a*'**.

The second body **100*b*' is different from the second body 100*b* of the first embodiment in a newly provided fitting depression 111*b*' formed in the center of a front surface in the insertion direction γ of the main body 110*b*', and positions of fitting projections 120*b*'. Descriptions made hereinafter focus on the differences. The fitting depressions 111*b*' are generally rectangular and adapted to fittingly receive the fitting projection 116*a*'. The pair of fitting projections 120*b*' is provided in the bottom of the fitting depression 111*b*'. The fitting projections 120*b*' are to fit in the fitting holes 115*a*' in the rear surface of the fitting projection 116*a*'. The main body 110*b*' and hills 130*b*' abut the lower surface of the top plate 320' of the shield case 300' as shown in FIGS. 10A to 10**D.

The receptacle connector having the above-described configuration may be assembled in the following steps. First, as shown in FIGS. 11 and 12, the embedded portions **210*a*, 210*b* of the first and second contacts 200*a*, 200*b* are embedded in the first body 100*a*' by insert molding, and the embedded portions 210*c*, 210*d* of the third and fourth contacts 200*c*, 200*d* are embedded in the second body 100*b*' by insert molding. The embedded first and second contacts 200*a*, 200*b* are arrayed in a row in the width direction δ in the first body 100*a*', and the third and fourth contacts 200*c*, 200*d* are arrayed in a row in the width direction δ in the second body 100*b*'. Simultaneously, the contact portions 220*a*, 220*b* of the first and second contacts 200*a*, 200*b* are inserted into the first and second long grooves 121*a*', 131*a*' of the first body 100*a*'**.

Thereafter, the first and second bodies **100*a*', 100*b*' are brought relatively closer to each other, and the contact portions 220*c*, 220*d* of the third and fourth contacts 200*c*, 200*d* of the second body 100*b*' are inserted into the first and second holes 111*a*', 112*a*' and the third and fourth long grooves 122*a*', 132*a*' of the first body 100*a*'. As a result, the contact portions 220*a* and the contact portions 220*c* are arranged at different height positions in a zigzag manner, and the contact portions 220*b* and the contact portions 220*d* are arranged at the different height positions in a zigzag manner. Simultaneously, the second body 100*b*' is inserted between the pair of guides 140*a*' of the first body 100*a*', using the guides 140*a*' of the first body 100*a*' to guide the widthwise ends of the second body 100*b*'. Consequently, the fitting projection 116*a*' of the first body 100*a*' fits in the fitting depression 111*b*' of the second body 100*b*' and the fitting projections 120*b*' of the second body 100*b*' fits in the fitting holes 115*a*' of the first body 100*a*'. Consequently, the first and second bodies 100*a*', 100*b*' are combined anteroposteriorly in the insertion direction γ, so that the tail portions 230*a*, 230*c* are arranged at the same height in two anteroposterior rows in the insertion direction γ, and the tail portions 230*b*, 230*d*** are arranged at the same height in two anteroposterior rows in the insertion direction γ.

Thereafter, the reinforcing member **160*a*' of the first body 100*a*' is fittingly inserted into the depression 312' of the shield case 300'. During this insertion, the reinforcing member 160*a*' is guided by the depression 312' along the insertion direction γ. The first and second bodies 100*a*', 100*b*' are simultaneously inserted between the lock pieces 340' as straightened along the side plates 330'. Simultaneously, the first and second bodies 100*a*', 100*b*' are inserted along the insertion direction γ, from the rear side into the accommodating space of the shield case 300' while the widthwise ends of the first body 100*a*' are guided by the lock pieces 340', and the first and second projected portions 120*a*', 130*a*' of the first body 100*a*' are inserted into the first and second slots α, β of the shield case 300'. Consequently, the front surface of the main body 110*a*' of the first body 100*a*' abuts the partition 311'; the elongated protrusions 150*a*' of the first body 100*a*' abut the respective abutting-stop surfaces 313', 314' of the bottom plate 310' of the shield case 300'; and the abutting-stops 323', 324' of the top plate 320' of the shield case 300' are received from the front side in the cutaways 113*a*', 114*a*' of the first body 100*a*' and abut back surfaces of the cutaways 113*a*', 114*a*'. The guides 140*a*', the main body 110*b*' and the hills 130*b*' abut the top plate 320' of the shield case 300'**.

In this state, the lock pieces 340' are bent inward to abut the hills **130*b*' of the second body 100*b*'. Consequently, the first and second bodies 100*a*', 100*b*' are securely sandwiched between the lock pieces 340' and front abutting portions (namely, the partition 311' and the abutting-stop surfaces 313', 314' of the bottom plate 310' and the abutting-stops 323', 324' of the top plate 320'), so that the first and second bodies 100*a*', 100*b*' are fixedly accommodated in the accommodating space of the shield case 300'**.

The receptacle connector may be thus assembled and may be mounted on the circuit board 10 in a similar manner to the first embodiment. First, the front terminals 331' and the rear terminals 332' of the shield case 300' are inserted into the above-mentioned through-hole electrodes of the circuit board 10. Simultaneously, the locking projections **170*a*' of the first body 100*a*' are inserted into and locked against the locking holes of the circuit board 10. Consequently, the outer surface of the bottom plate 310' of the shield case 300' is placed on the circuit board 10, so that the pads 317' of the shield case 300' come into contact with the pair of ground electrodes 11 of the circuit board 10, and the tail portions 230*a*, 230*b*, 230*c*, 230*d* come into contact with the surface electrodes of the circuit board 10. Thereafter, the front terminals 331' and the rear terminals 332' are soldered to the through-hole electrodes of the circuit board 10, the pads 317' are soldered to the pair of ground electrodes 11, and the tail portions 230***a*, 230*b*, 230*c*, 230*d* are soldered to the surface electrodes of the circuit board 10. Solder fillets are thus formed between the second pad portions 317*b*' of the pads 317' and the ground electrodes 11.

The receptacle connector described above also produce similar advantageous effects to those of the receptacle connector of the first embodiment.

Third Embodiment

Finally, a third embodiment of the invention will be described with reference to FIGS. 13A to 18. The receptacle connector shown in FIGS. 13A to 15B is compliant with an HDMI (High-Definition Multimedia Interface, registered trademark) standard. It is adapted to be mounted on a circuit board 50 of electronic equipment such as a television receiver and is used as an external interface of the electronic equipment. The receptacle connector includes first and second bodies 400*a*, 400*b*, a plurality of first and second contacts 500*a*, 500*b*, and a shield case 600. These respective elements will be described in detail below. For convenience of explanation, FIG. 16 indicates an insertion direction γ (second direction) and a width direction δ (first direction). The insertion direction γ is the direction to insert the first and second bodies 400*a*, 400*b* into an accommodating space (to be described) of the shield case 600. The with direction δ is the width direction of the shield case 600 and the orthogonal direction to the insertion direction γ.

Figure 17:
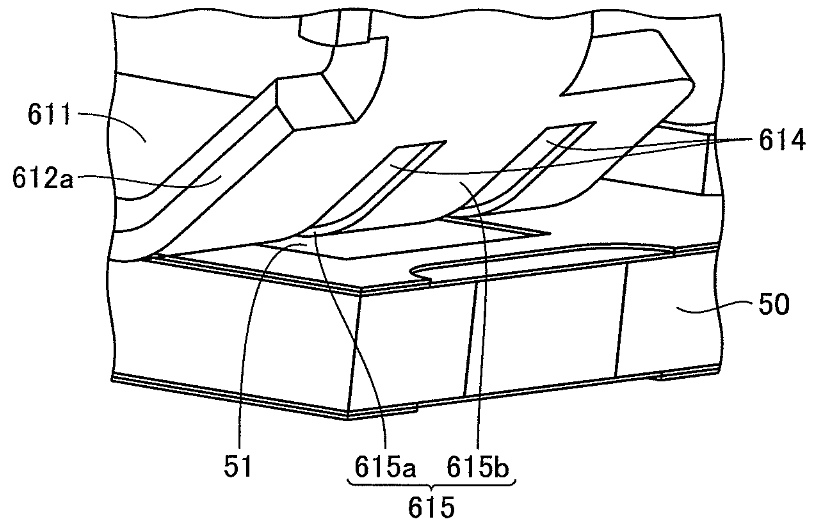
FIG. 17 is an explanatory view showing a state where a pad of a shield case of the connector is connected by soldering to an electrode of a circuit board.
Figure 18:
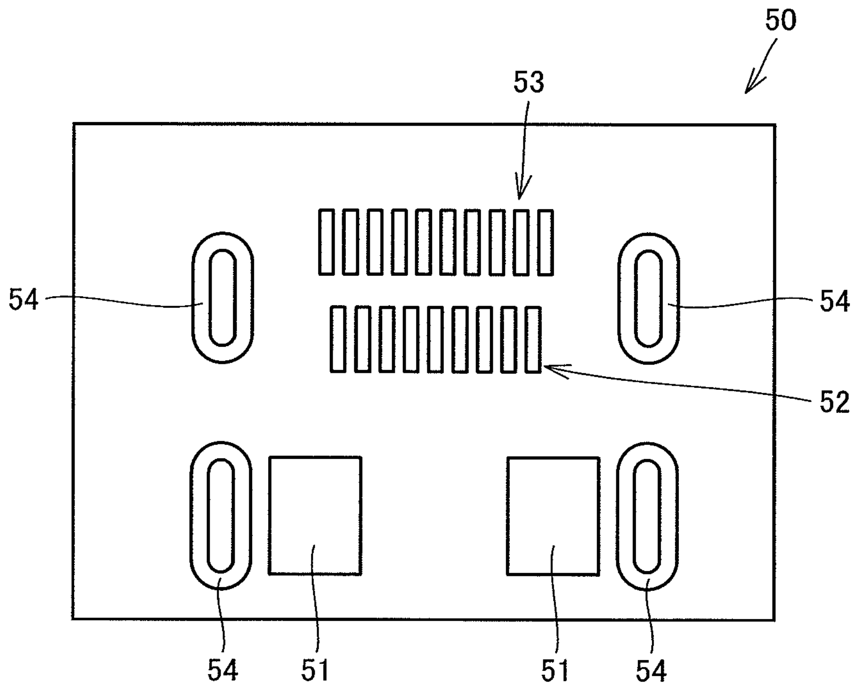
FIG. 18 is a schematic plan view of the circuit board for mounting the connector.

The circuit board 50 is a well-known printed circuit board, as shown in FIG. 18. The board 50 includes a pair of ground electrodes 51, a plurality of surface electrodes 52, 53 disposed in two rows in a zigzag manner, and two pairs of through-hole electrodes 54 disposed outside the ground electrodes 51 and the surface electrodes 52, 53. As shown in FIG. 17, the ground electrodes 51 are generally rectangular surface electrodes, each having a contactable portion contactable to a first pad portion 615*a* (to be described) of the shield case 600 and an extended portion extended from the contactable portion toward a second pad portion 615*b* (to be described) so as to face the second pad portion 615*b*. The ground electrodes 51 and the through-hole electrodes 54 are connected to a ground line (not shown) of the circuit board 50.

Figure 15A:
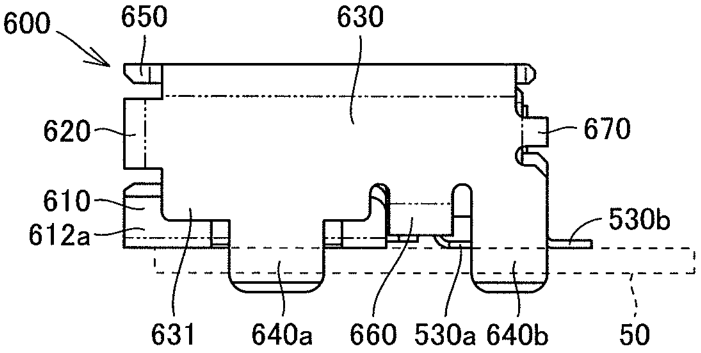
FIGS. 15A and 15B are schematic views of the connector as mounted on a circuit board, where
Figure 15B:
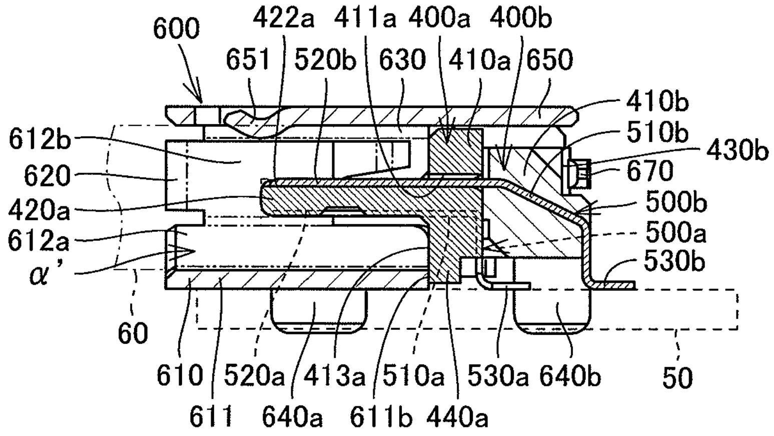
Figure 16:
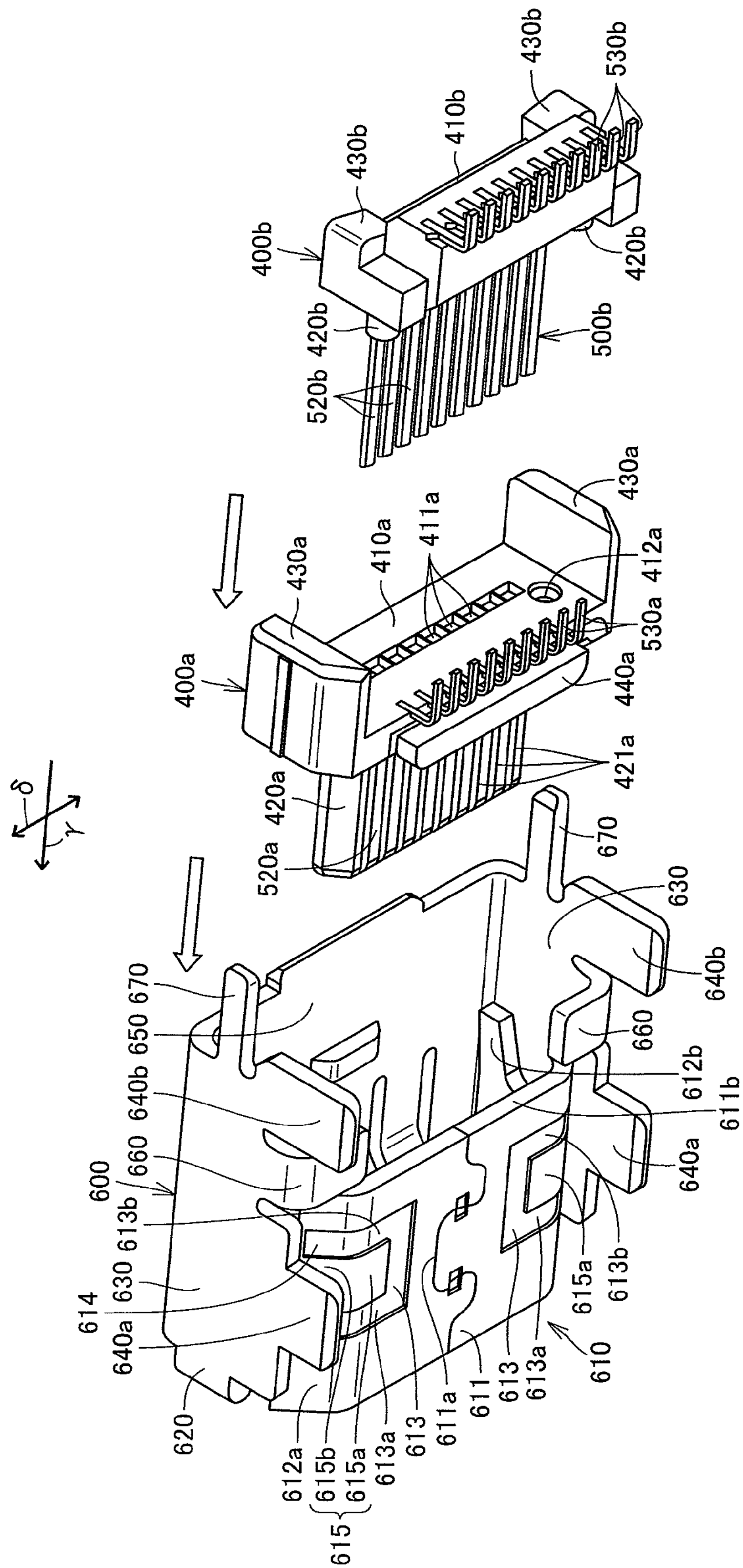
FIG. 16 is a schematic exploded perspective view of the connector as seen from the back, bottom and right side.

As shown in FIG. 16, the first and second bodies 400*a*, 400*b* are combined anteroposteriorly in the insertion direction γ, inserted into the shield case 600 from the rear side, and accommodated in the shield case 600. The first body 400*a* is a molded article of insulating resin as shown in FIG. 15B to 16. The first body 400*a* has a main body 410*a*, a projected portion 420*a*, a pair of guides 430*a*, and an elongated protrusion 440*a*. The main body 410*a* is a plate having a generally rectangular cross-section. A plurality of generally rectangular holes 411*a* pass in the insertion direction γ through the center of the main body 410*a* to be arranged at spaced intervals in a row in the width direction δ. Below the holes 411*a* of the main body 410*a*, the first contacts 500*a* are arranged at spaced intervals in a row in the width direction δ. The arranged first contacts 500*a* are shifted in phase with the holes 411*a*. In other words, each of the first contacts 500*a* is located at plan position between the adjacent holes 411*a*. The rear surface in the insertion direction γ of the main body 410*a* has a pair of circular fitting depressions 412*a* (only one of which is shown in the figure) outside the holes 411*a*. The pair of generally rectangular guides 430*a* project rearward from widthwise end portions of the main body 410*a*.

Figure 14C:
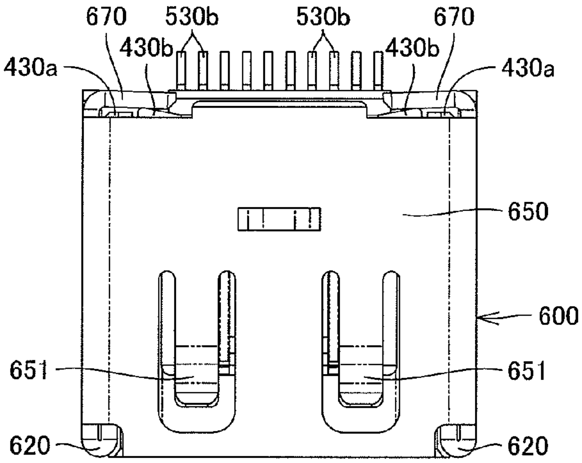
FIGS. 14A to 14D are schematic views of the connector, where
Figure 14A:
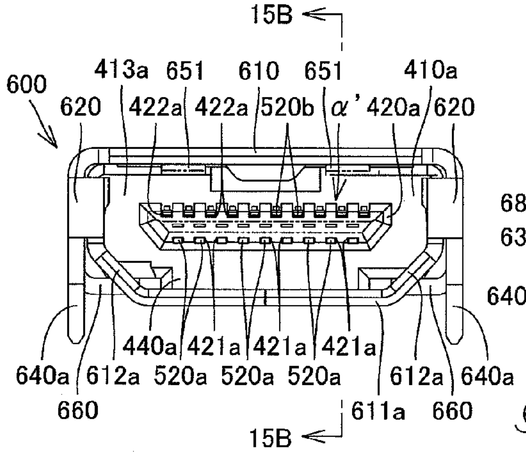

A front surface 413*a* in the insertion direction γ of the main body 410*a* serves as an abutting surface on which a connection portion of a mating plug connector 60 is abuttable. The projected portion 420*a* is provided on the front surface 413*a* of the main body 410*a*, below the holes 411*a*. The projected portion 420*a* is a plate extending forward in the insertion direction γ and is received in the slot α of the shield case 600. The projected portion 420*a* has such an outer shape as to fit in a connection hole (not shown) of the connection part of the plug connector 60. The lower surface of the projected portion 420*a* has a plurality of first long grooves 421*a*. The upper surface of the projected portion 420*a* has a plurality of second long grooves 422*a*, as shown in FIG. 14A. The first and second long grooves 421*a*, 422*a* are arranged in a zigzag manner in front view. The pitch interval of the first long grooves 421*a* corresponds to the pitch interval of the first contacts 500*a*. The first long grooves 421*a* are adapted to receive contact portions 520*a* (to be described) of the first contacts 500*a*. The pitch interval of the second long grooves 422*a* corresponds to the pitch interval of the holes 411*a*. The second long grooves 422*a* communicate with the holes 411*a*, as shown in FIG. 15B. The lower surface of the main body 410*a* is provided with the elongated protrusion 440*a* of generally rectangular shape. The elongated protrusion 440*a* is located forward of and close to tail portions 530*a* (to be described) of the first contacts 500*a*.

Each of the first contacts 500*a* is a conductive elongated metal plate. As shown in FIG. 15B, each of the first contacts 500*a* has a substantially downward L-shaped embedded portion 510*a*, the flat plate-like contact portion 520*a* extending continuously from a distal end of the embedded portion 510*a*, and the flat plate-like tail portion 530*a* continuously extending from a rear end of the embedded portion 510*a*. The embedded portion 510*a* except its rear end portion is embedded in the main body 410*a*, and the rear end portion projects downward from the main body 410*a*. The contact portion 520*a* projects from the main body 410*a* to be received in one of the first long grooves 421*a* of the projected portion 420*a*. The tail portion 530*a* is bent substantially at a right angle to the rear end of the embedded portion 510*a*. The tail portions 530*a* is connectable by soldering to the associated surface electrodes 52 of the circuit board 50.

The second body 400*b* is a molded article of insulating resin as shown in FIG. 15B to 16. The second body 400*b* has a body portion 410*b*, a pair of fitting projections 420*b* and a pair of hills 430*b*. The body portion 410*b* has a generally L-shaped cross-section, and its width is a little smaller than a distance between the guides 430*a* of the first body 400*a*. The body portion 410*b* is to be received between the guides 430*a* of the first body 400*a*. The pair of fitting projections 420*b* is provided on widthwise end portions of a front surface in the insertion direction γ of the body portion 410*b*. The fitting projections 420*b* are columnar projections to fit in the fitting depressions 412*a* of the first body 400*a*. The fit between the fitting projections 420*b* and the fitting depressions 412*a* allows the first and second bodies 400*a*, 400*b* to be maintained in a combined state anteroposteriorly in the insertion direction γ. The body portion 410*b* accommodates the second contacts 500*b* arranged at spaced intervals in a row in the width direction δ. The second contacts 500*b* are arranged such that their contact portions 520*b* (to be described) correspond to the positions of the holes 411*a* of the first body 400*a*. When the first and second bodies 400*a*, 400*b* are combined, the contact portions 520*b* of the second contacts 500*b* are received in the holes 411*a* and the second long grooves 422*a* of the first body 400*a*, so that the contact portions 520*a*, 520*b* of the first and second contacts 500*a*, 500*b* are arranged at different height positions in two rows in a zigzag manner. The pair of hills 430*b* is provided on widthwise end portions of a rear surface in the insertion direction γ of the body portion 410*b*. Tips of the hills 430*b* project rearward from the guides 430*a* when the first and second bodies 400*a*, 400*b* are combined, as shown in FIG. 14C.

Each of the second contacts 500*b* is a conductive elongated metal plate. As shown in FIG. 15B, the second contacts 500*b* each have an embedded portion 510*b*, the contact portion 520*b* extending continuously from a distal end of the embedded portion 510*b*, and a tail portion 530*b* continuously extending from a rear end of the embedded portion 510*b*. The embedded portion 510*b* has an obliquely inclined intermediate portion, and a distal portion bent with respect to the intermediate portion, and a rear portion bent with respect to the intermediate portion and extended downward. The distal portion and the intermediate portion of the embedded portion 510*b* are embedded in the body portion 410*b*. The rear portion of the embedded portion 510*b* projects downward from the body portion 410*b*. The contact portion 520*b* is a flat plate projecting from the front surface of the body portion 410*b* and is longer than the contact portion 520*a*. The contact portion 520*b* is to be received in one of the holes 411*a* and one of the second long grooves 422*a* of the first body 400*a*, as described above. The tail portion 530*b* is a flat plate bent substantially at a right angle to the rear portion of the embedded portion 510*b* and is connectable by soldering to one of the surface electrodes 53 of the circuit board 50. The tail portion 530*b* is configured such that its lower surface is located at the same height position as that of a lower surface of the tail portion 530*a* in the state where the first and second bodies 400*a*, 400*b* are combined. With the first and second bodies 400*a*, 400*b* combined, the tail portions 530*a*, 530*b* are arrayed in two anteroposterior rows in the insertion direction γ.

The shield case 600 is a tuboid body fabricated by press-molding a conductive metal plate, as shown in FIG. 13A to 16. The shield case 600 has a substantially U-shaped base 610, a pair of folded-back portions 620 (first and second folded-back portions), a pair of outer walls 630 (first and second outer walls), pairs of front and rear terminals 640*a*, 640*b* (first and second connecting terminals), a coupling plate 650 (coupling portion), a pair of holders 660, and a pair of lock pieces 670.

Figure 14B:
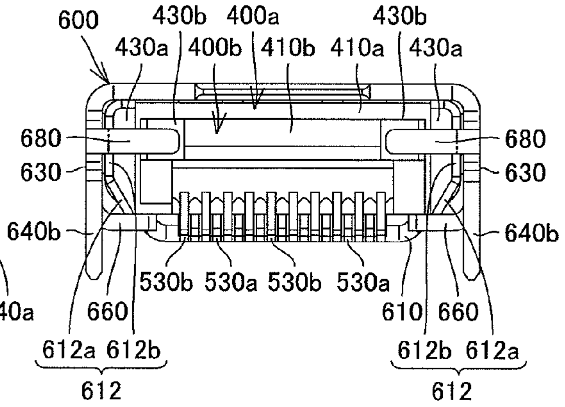
Figure 14D:
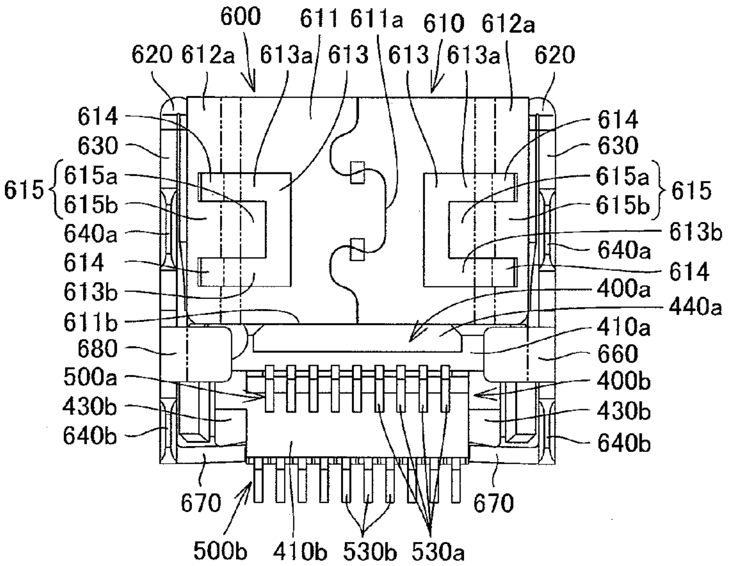

The base 610 has a bottom plate 611, and a pair of side plates 612 provided upright at opposite ends (first and second ends) in a width direction δ (first direction) of the bottom plate 611, as shown in FIGS. 14A, 14B and 15B. The bottom plate 611 is a rectangular plate, and its outer surface (first surface) is adapted to be set on the circuit board 50. The bottom plate 611 has a joining portion 611*a* in its center. The joining portion 611*a* is a portion where end portions of a metal plate forming the shield case 600 are joined and swaged. As shown in FIG. 15B, a rear surface in the insertion direction γ of the bottom plate 611 serves as an abutting-stop surface 611*b* to abut a front surface in the insertion direction γ of the elongated protrusion 440*a* of the first body 400*a* accommodated in the accommodating space of the shield case 600 and to stop the first body 400*a*.

Figure 13A:
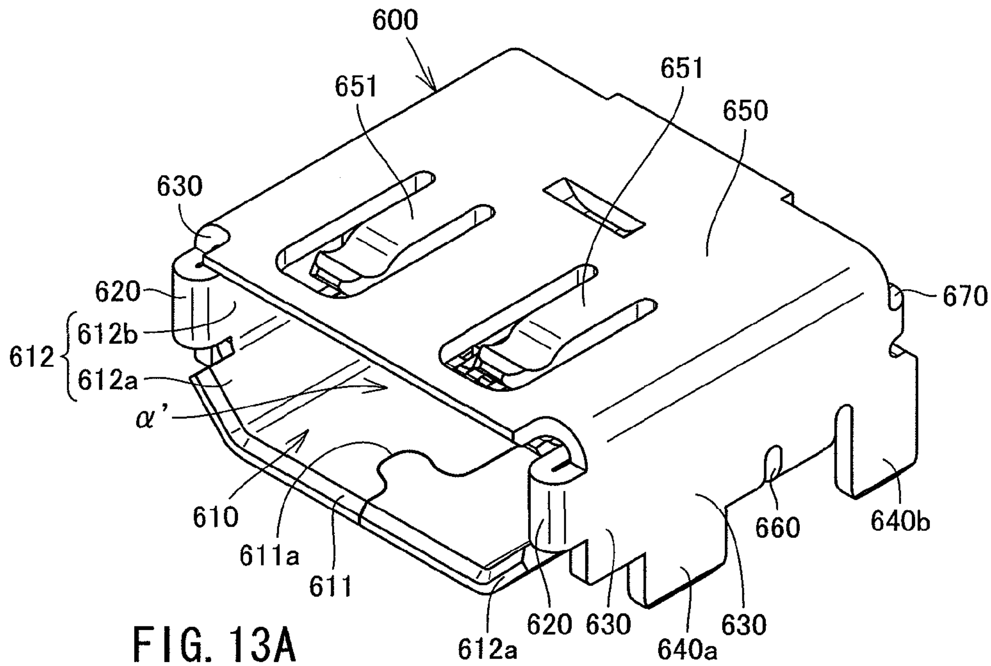
FIGS. 13A and 13B are schematic perspective views of a connector according to a third embodiment of the present invention, where
Figure 13B:
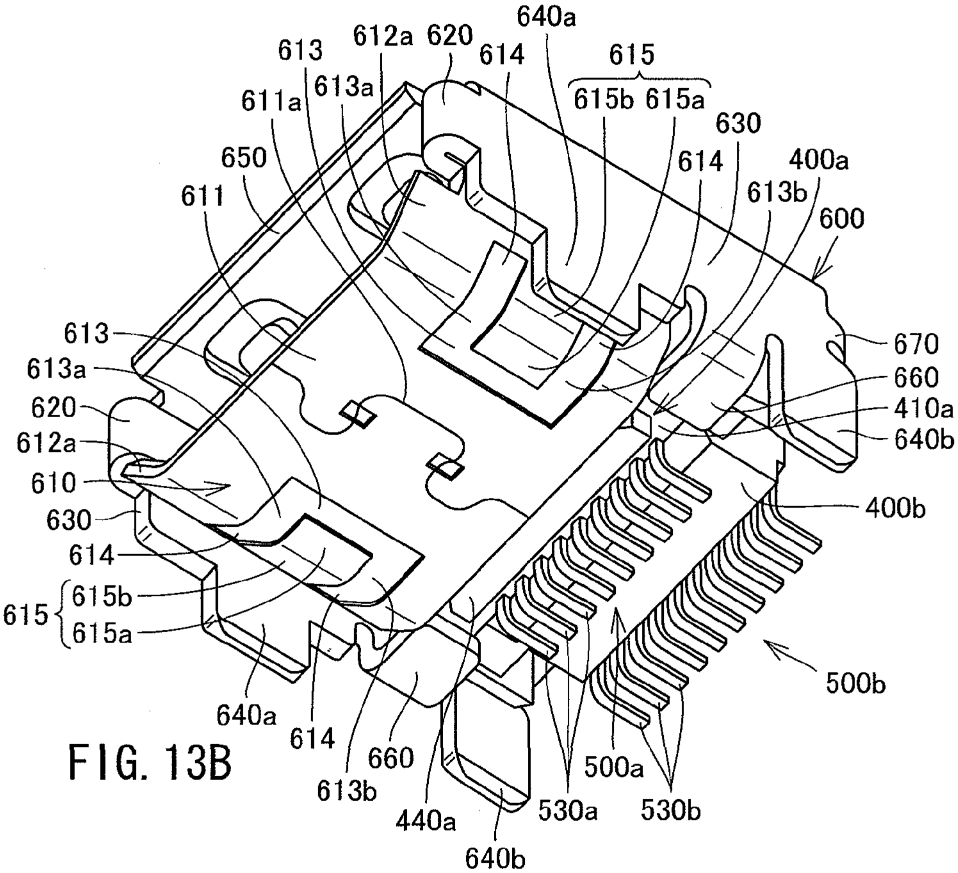

The side plates 612 each have an inclined portion 612*a* and an extended portion 612*b*. The inclined portions 612*a* extend continuously from opposite ends of the bottom plate 611 and are bent in an inclined manner with respect to the bottom plate 611. Thus, outer surfaces (second surface) of the inclined portions 612*a* are also inclined (i.e. at an angle) with respect to the outer surface (first surface) of the bottom plate 611. As shown in FIGS. 13B and 16, in each of boundary areas of the outer surface of the bottom plate 611 with the outer surfaces of the inclined portions 612*a*, there is formed a substantially U-shaped first recess 613 having first and second end portions 613*a*, 613*b*. The first recesses 613 of U-shape have mouths opening outward. In each of boundary areas of the outer surfaces of the inclined portions 612*a* with the outer surface of the bottom plate 611, there is formed a pair of rectangular second recesses 614 communicating with the first and second end portions 613*a*, 613*b* of the first recess 613. Areas defined by the first and second recesses 613, 614 serve as pads 615 for connection by soldering with the pair of ground electrodes 51 of the circuit board 50. The pads 615 each have the first and second pad portions 615*a*, 615*b*. The first pad portions 615*a* are provided in the outer surface of the bottom plate 611. The surfaces of the first pad portions 615*a* are located at the same height as (i.e. flush with) the outer surface of the bottom plate 611. The second pad portions 615*b* are provided in the outer surfaces of the inclined portions 612*a* and are inclined with respect to the first pad portions 615*a*. The surfaces of the second pad portions 615*b* are located at the same height as (i.e. flush with) the outer surface of the inclined portions 612*a*. The extended portions 612*b* are generally inverted L-shaped plates extending from upper ends of the inclined portions 612*a*, as shown in FIG. 15B. The folded-back portions 620 are provided continuously at front ends in the insertion direction γ (first end in the second direction) of the extended portions 612*b*.

The folded-back portions 620 are plates of generally U-shape in plan view, folded back from the extended portions 612*b* toward the rear end in the insertion direction γ (second end in the second direction) of the extended portions 612*b*. The outer ends of the folded-back portions 620 are continuous with the outer walls 630. The outer walls 630 are generally rectangular plates extending rearward in the insertion direction γ along the extended portions 612*b*, and they are longer than the base 610. Upper ends of the outer walls 630 are coupled through the coupling plate 650. The coupling plate 650 is a generally rectangular plate of substantially the same length as each length of the outer walls 630. That is, the length in the insertion direction γ of the coupling plate 650 is larger than the length in the insertion direction γ of the base 610. Rear end portions in the insertion direction γ of the outer walls 630 and a rear end portion in the insertion direction γ of the coupling plate 650 define the accommodating space. The base 610, front end portions in the insertion direction γ of the outer walls 630, a front end portion in the insertion direction γ of the coupling plate 650, and the front surface 413*a* of the first body 400*a* define a slot α'. The accommodating space is adapted to receive and accommodate the first and second bodies 400*a*, 400*b* from the rear side. The slot α' has an inner shape conforming to an outer shape of the connection portion for HDMI of the plug connector 60. That is, the slot α' is adapted to receive the connection portion of the plug connector 60.

The lock pieces 670 are provided on rear surfaces of the outer walls 630. The lock pieces 670 are bent substantially at a right angle to the outer walls 630 to abut the pair of hills 430*b* of the second body 400*b*. The first and second bodies 400*a*, 400*b* are securely sandwiched between the lock pieces 670 and the abutting-stop surface 611*b* of the bottom plate 611, so that the bodies 400*a*, 400*b* are fixed in position inside the accommodating space. It is appreciated that FIG. 16 illustrates the lock pieces 670 in a straightened state before bent. Moreover, the coupling plate 650 is provided with a pair of locking pieces 651, formed by cutting out portions of the coupling plate 650, as shown in FIG. 13A. Distal portions of the locking pieces 651 are bent generally into inverted U shapes, and summits of the distal portions are located inside the slot α' (refer to FIG. 15B). Thus, When inserting the plug connector 60 in the slot α', the summits of the locking pieces 651 elastically contact and hold the plug connector 60.

A lower end of each of the outer walls 630 is provided with the front terminal 640*a* and the rear terminal 640*b* extended downward. The holders 660 are provided at the lower ends of the outer walls 630, between the front terminals 640*a* and the rear terminals 640*b*. The front and rear terminals 640*a*, 640*b* are legs that are insertable into the through-hole electrodes 54 of the circuit board 50. It should be noted that the front terminals 640*a* are located forward of the front surface 413*a* of the main body 410*a* of the first body 400*a* accommodated in the accommodating space, as shown in FIG. 15B. If the plug connector 60 inserted into the slot α' is twisted with a cable (not shown) connected to the plug connector 60 serving as a point of effort (if the plug connector 60 is rotated in a circumferential direction), the shield case 600 will take load with the distal end of the plug connector 60 serving as a fulcrum. However, as the front terminals 640*a* are located forward of the front surface 413*a* of the main body 410*a* on which the distal end of the plug connector 60 abuts (i.e., the front terminals 640*a* are closer to the point of effort than the fulcrum), the load on the front terminals 640*a* can be reduced as compared with a case where the front terminals 640*a* are located rearward of the abutting surface (i.e. case where they are located rearward of the fulcrum).

The holders 660 are L-shaped plates bent inward. The holders 660 are used to hold outer portions of the elongated protrusion 440*a* (to be described) of the main body 410*a* of the first body 400*a*, as shown in FIG. 14B. The distance between the holders 660 and the coupling portion 650 is substantially the same as the height dimension of the main body 410*a* of the first body 400*a*, so that an upper surface of the main body 410*a* abuts the coupling plate 650 in a state where the holders 660 hold the main body 410*a*. Moreover, the distance between the outer walls 630 is substantially the same as the distance between outer surfaces of the guides 430*a* of the first body 400*a*, so that the outer surfaces of the guides 430*a* of the first body 400*a* abut inner surfaces of the outer walls 630.

The receptacle connector having the above-described configuration may be assembled in the following steps. First step is to prepare the first body 400*a* with the embedded portions 510*a* of the first contacts 500*a* embedded therein by insert molding and the second body 400*b* with the embedded portions 510*b* of the second contacts 500*b* embedded therein by insert molding. Thereafter, the contact portions 520*b* of the second contacts 500*b* are aligned in position and inserted into the holes 411*a* of the first body 400*a*. Thereafter, the first body 400*a* and the second body 400*b* are moved relatively closer to each other, and the fitting projections 420*b* of the second body 400*b* are fitted in the fitting depressions 412*a* of the first body 400*a*. Simultaneously, the contact portions 520*b* move through the holes 411*a* of the first body 400*a* and then enter the second long grooves 422*a* of the first body 400*a*. The contact portions 520*a*, 520*b* are thus arranged at the different height positions in two (upper and lower) rows in a zigzag manner. The tail portions 530*a*, 530*b* are arranged at the same height in two anteroposterior rows. The first body 400*a* and the second body 400*b* are now combined anteroposteriorly in the insertion direction γ.

The combined first and second bodies 400*a*, 400*b* are then inserted into the accommodating space of the shield case 600 from the rear side, and the front surface of the elongated protrusion 440*a* of the first body 400*a* is brought into abutment with the abutting-stop surface 611*b* of the base 610 of the shield case 600. Simultaneously, the projected portion 420*a* is inserted into the slot α' of the shield case 600, and the outer portions of the elongated protrusion 440*a* of the main body 410*a* of the first body 400*a* are placed on the holders 660. The upper surface of the main body 410*a* thus abuts the coupling plate 650, and the guides 430*a* abut the inner surfaces of the outer walls 630. Thereafter, the lock pieces 670 are bent to abut the hills 430*b* of the second body 400*b*. As a result, the first and second bodies 400*a*, 400*b* are securely sandwiched between the abutting-stop surface 611*b* of the base 610 and the lock pieces 670, so that the contact portions 520*a*, 520*b* and the tail portions 530*a*, 530*b* are fixed in position in the above-described arrangement.

The receptacle connector may be thus assembled and may be mounted on the circuit board 50 in the following manner. First, the front and rear terminals 640*a*, 640*b* of the shield case 600 are inserted into the through-hole electrodes 54 of the circuit board 50. Consequently, the outer surface of the base 610 of the shield case 600 is set on the circuit board 50, and the pads 615 of the shield case 600 come into contact with the pair of ground electrodes 51 of the circuit board 50 (refer to FIG. 17), and the tail portions 530*a*, 530*b* of the first and second contacts 500*a*, 500*b* come into contact with the surface electrodes 52, 53 of the circuit board 50. Thereafter, the front and rear terminals 640*a*, 640*b* are soldered to the through-hole electrodes 54 of the circuit board 50, the pads 615 are soldered to the ground electrodes 51 of the circuit board 50, and the tail portions 530*a*, 530*b* are soldered to the surface electrodes 52, 53, respectively, of the circuit board 50. After the soldering, solder fillets are formed between the second pad portions 615*b* of the pads 615 and the ground electrodes 51.

In the above-described receptacle connector, no clearance is produced between the outer surface of the bottom plate 611 and the circuit board 50 when the outer surface of the bottom plate 611 is placed on the circuit board 50. This is because the first recesses 613 are formed in the outer surface of the bottom plate 611 of the shield case 600, and the second recesses 614 are formed in the opposite outer surfaces of the inclined portion 612*a* of the side plates 612 of the shield case 600; the portions defined by the first and second recesses 613, 614 function as the pads 615; and the first pad portions 615*a* of the pads 615 are flush with the outer surface of the bottom plate 611. Further advantageously, as the first pad portions 615*a* are surrounded by the substantially U-shaped first recesses 613, which minimizes unfavorable spread of solder into other areas of the outer surface of the bottom plate 611 facing the circuit board 50 during soldering work, and which minimizes intrusion of solder into the shield case 600 through the joining portion 611*a* of the bottom plate 611. The second pad portions 615*b* of the pads 615 are inclined with respect to the first pad portions 615*a*, allowing to form large solder fillets by applying solder to the second pad portions 615*b*. The present connector thus has an improved peel strength between its end portions and the circuit board. Further improvement of the peel strength therebetween can be pursued because the front and rear terminals 640*a*, 640*b* of the shield case 600 are connected by soldering to the through-hole electrodes 54 of the circuit board 50. In summary, the present receptacle connector has such a configuration as to provide high peel strength with respect to the circuit board.

Moreover, the nonexistence of clearance between the outer surface of the bottom plate 611 and the circuit board 50 is also favorable in reducing the mounting height of the receptacle connector. Furthermore, as the pads 615 are surrounded by the first and second recesses 613, 614, no openings are formed in the outer surface of the bottom plate 611 or in the inclined portions 612*a* of the side plates 612, unlike a case where connection terminals are formed by cutting and downwardly bending portions of the shield case. As the front and rear terminals 640*a*, 640*b* are provided in the outer walls 630 extending along the extended portions 612*b* of the side plates 612, the side plates 612 and the bottom plate 611 have no openings that may be formed when fabricating the front and rear terminals 640*a*, 640*b*. The nonexistence of openings can thus prevent intrusion of solder and flux into the shield case 600 through the bottom plate 611 or the side plates 612. The nonexistence of openings in the bottom plate 611 or the side plates 612 is also advantageous in securing favorable prying resistance of the shield case 600. Further improvement of prying resistance of the shield case 600 can also be pursued because the upper ends of the outer walls 630 are coupled by the coupling plate 650.

The receptacle connector of the invention is not limited to the ones described as the above embodiment, but it may be modified in design within the scope of claims. Examples of modifications are described more in detail below.

The shield case according to the first to third embodiments is a press-molded conductive metal plate, but the shield case may be modified in design as long as it is tuboid and has an internal space for accommodating a body. For example, the shield case may be formed of insulating resin or ceramic material in a tuboid shape, the outer surface of which may be deposited with metal. Alternatively, the shield case may be of conductive metal cast into a tuboid shape.

The shield case may have two slots as in the first and second embodiments, but it may have only one slot as in the third embodiment. Alternatively, the shield case may have three or more slots, by providing a plurality of bent portions, attaching separately formed partitions to the inside of the shield case, or providing both the bent portion(s) and the partition plate(s). Further, the bent portion may be used as a partition as in the first and second embodiments, but it may be used as a key portion to fit in a key groove of a mating connector so as to prevent insertion of a nonconforming connector, such as ones with no key groove or with a different type of key groove. The bent portion may extend through from the front end (first end) to the rear end (second end) in the insertion direction of the bottom plate as in the first and second embodiments, but it may be modified in design as long as it is bent inside the shield case and extends in the insertion direction.

The first and second recesses of the first and second embodiments are provided in the boundary areas between the outer surface of the bottom plate and the inner surfaces of the lower depressed portion, while the first and second recesses of the third embodiment are provided in the boundary areas between the outer surface of the bottom plate and the outer surfaces of the inclined portions of the side plates. However, the first and second recesses may be provided anywhere, as long as they are provided in boundary areas between first and second continuing surfaces of the shield case at an angle or at a right angle with respect to each other. For example, the connector of the first or second embodiment may be modified into such a configuration that the inner surfaces of the depression extend substantially at a right angle to the outer surface of the bottom plate, and the connector of the third embodiment may be modified into such a configuration that the outer surfaces of the side plates extend substantially at a right angle to the outer surface of the bottom plate. The second recesses may be generally rectangular as in the first and second embodiments, but they may be of any shape as long as they communicate with first and second end portions of the first recesses. For example, the second recesses may be curved such that their ends communicate with each other. The pads of the first to third embodiments are described above by way of example only, and they may be modified in accordance with the shapes of the first and second recesses.

In the connector of the third embodiment, the folded-back portions are provided continuously at the front ends in the insertion direction of the extended portions of the side plates, the outer walls are provided continuously to the outer ends of the folded-back portions, and the front and rear terminals serving as the connecting terminals extend from the outer walls. However, the connecting terminals may be configured like the front terminals in the first and second embodiments, formed by cutting portions of the side plate so as to extend downward. Moreover, the upper ends of the outer walls may be coupled by the coupling plate as in the third embodiment, but the present invention is not limited thereto. The coupling plate may be omitted if the shield case has a top plate to couple the upper ends of the side plates. In place of the coupling plate in plate shape, the outer walls may be coupled by a coupling portion that may be of rod-like or similar shape. Alternatively, the coupling portion may be provided separately from the outer walls and may couple the outer walls by being press-fitted into holes formed in the outer walls.

The front and rear terminals may be provided at the lower ends of the side plates as in the first and second embodiments, but the present invention is not limited thereto. For example, as in the third embodiment, the front and rear terminals may be provided at the outer walls that are continuous with the outer ends of the folded-back portions that are continuous with the front ends in the insertion direction of the side plates. The connecting terminals are not limited to ones to be connected by soldering to the through-hole electrodes as in the first to third embodiments. For example, the connecting terminals may be bent outward to extend substantially parallel to the bottom plate and soldered to the surface electrodes of the circuit board. Moreover, the connecting terminals may be the pairs of front and rear terminals as in the first to third embodiments, but the present invention is not limited thereto. The connector may only have the front terminals or the rear terminals. Both the front and rear terminals may be omitted if the shield case can yield a predetermined peel strength with the existence of the pads only.

The reinforcement member may fit in a part of the depression on the back side of the partition of the shield case as in the first and second embodiments. Alternatively, the reinforcement member may fit in the entire depression to increase the prying resistance of the shield case.

The connector of the first to third embodiments includes the first and second bodies, but the present invention requires at least one body. The connector of the invention requires at least one type of contacts. The contacts may not be embedded in the body but may be inserted into holes formed in the body. The tail portions of the contacts may be arrayed in the two anteroposterior rows in the insertion direction as in the first to third embodiments, but they may be arrayed in a row. Moreover, the tail portions may extend downward to be connected to the through-hole electrodes of the circuit board.

The materials, shapes, numbers, dimensions etc. of the respective elements of the receptacle connector in the first to third embodiments have been described by way of example only, and they may be modified in design in any manner as long as they provide similar functions. The present invention is not limited to the connectors compliant with HDMI standards as in the first to third embodiments. In the connector of the first and second embodiments, the first slot is compliant with the HDMI-mini standard and the second slot is compliant with the HDMI standard, but the inner shapes of the first and second slots may be modified in design in accordance with the mating connector(s). For example, the first and second slots may have the same internal shape so as to receive with mating connectors of the same type. Furthermore, the present invention is applicable not only to receptacle connectors but also to plug connectors with a cable connected to an end of a circuit board. Moreover, the television receiver is mentioned above as exemplifying the electronic equipment, but the present invention is not limited thereto.

REFERENCE SIGNS LIST

10 circuit board
20 plug connector
30 plug connector
40 plug connector
50 circuit board
60 plug connector
100*a* first body
100*b* second body
200*a* first contact
200*b* second contact
200*c* third contact
200*d* fourth contact
300 shield case
310 bottom plate
311 partition (bent portion)
312 depression (depressed surface of partition)
315 first recess
315*a* first end portion
315*b* second end portion
316 second recess
317 pad
317*a* first pad portion
317*b* second pad portion
330 side plate (first or second side plate)
331 front terminal (first or second connecting terminal)
331 rear terminal (first or second connecting terminal)
400*a* first body
400*b* second body
500*a* first contact
500*b* second contact
600 shield case
611 bottom plate
612 side plate (first or second side plate)
613 first recess
613*a* first end portion
613*b* second end portion
614 second recess
615 pad
615*a* first pad portion
615*b* second pad portion
620 folded-back portion (first or second folded-back portion)
630 outer wall (first or second outer wall)
640*a* front terminal (first or second connecting terminal)
640*b* rear terminal (first or second connecting terminal)
650 coupling plate

The invention claimed is:

1. A shield case having electrical conductivity and being mountable on a circuit board, the shield case comprising:
a first surface adapted to be placed on the circuit board;
a second surface provided continuously with the first surface and extending at one of an angle and a right angle with respect to the first surface;
a first recess of generally U-shape, being provided in a boundary area of the first surface with the second surface and including first and second end portions, the first recess having a bottom;
a pair of second recesses, being provided in a boundary area of the second surface with the first surface and communicating with the first and second end portions of the first recess, the second recesses having bottoms; and
a pad, being surrounded and defined by the first and second recesses and connectable by soldering to an electrode of the circuit board.

2. The shield case according to claim 1, further comprising a partition to partition an internal space of the shield case into first and second slots.

3. A shield case having electrical conductivity and being mountable on a circuit board, the shield case comprising:
a first surface adapted to be placed on the circuit board;
a second surface provided continuously with the first surface and extending at an angle or at a right angle with respect to the first surface;
a bottom plate including an outer surface being the first surface;
a partition to partition an internal space of the shield case into first and second slots,
the partition including:
a central portion of the bottom plate bent inside the shield case, and
a depressed surface formed on the back of the partition and being the second surface;
a first recess of generally U-shape, being provided in a boundary area of the first surface with the second surface and including first and second end portions;
a pair of second recesses, being provided in a boundary area of the second surface with the first surface and communicating with the first and second end portions of the first recess; and
a pad, being defined by the first and second recesses and connectable by soldering to an electrode of the circuit board.

4. The shield case according to claim 3, the bottom plate including first and second ends in a first direction, the shield case further comprising:
first and second side plates, provided upright at the first and second ends, respectively; and
first and second connecting terminals, provided in the first and second side plates and adapted for connection with surface electrodes or through-hole electrodes of the circuit board.

5. A shield case having electrical conductivity and being mountable on a circuit board, the shield case comprising:
a first surface adapted to be placed on the circuit board;
a second surface provided continuously with the first surface and extending at an angle or at a right angle with respect to the first surface;
a bottom plate, including first and second ends in a first direction and an outer surface being the first surface;
first and second side plates, being provided upright at the first and second ends respectively of the bottom plate, the second surface of the shield case including outer surfaces of the first and second side plates;
a first recess of generally U-shape, being provided in a boundary area of the first surface with the second surface and including first and second end portions;
a pair of second recesses, being provided in a boundary area of the second surface with the first surface and communicating with the first and second end portions of the first recess; and
a pad, being defined by the first and second recesses and connectable by soldering to an electrode of the circuit board.

6. The shield case according to claim 5, wherein the first and second side plates each include first and second ends in a second direction perpendicular to the first direction, the shield case further comprising:

first and second folded-back portions, provided at the first ends of the first and second side plates and folded back toward the second ends thereof;

first and second outer walls, provided at the first and second folded-back portions to extend along the outer surfaces of the first and second side plates; and first and second connecting terminals, provided at the first and second outer walls and connectable to surface electrodes or through-hole electrodes of the circuit board.

7. The shield case according to claim 6, further comprising a coupling portion configured to couple the first outer wall and the second outer wall.

8. A connector comprising:

the shield case according to claim 1;

a body having an insulating property and being adapted to be received in the shield case; and a contact provided in the body.

9. Electronic equipment comprising:

the connector according to claim 8; and the circuit board, adapted to mount the connector thereon, wherein the pad of the shield case of the connector includes:

a first pad portion, provided in the first surface of the shield case, and a second pad portion, provided in the second surface of the shield case and extending at an angle or at a right angle with respect to the first pad portion, and the circuit board includes the electrode being contactable with the first pad portion and extending to a side of the second pad portion.

10. The shield case according to claim 1, wherein the pad comprises:

a first pad portion, provided in the first surface of the shield case and surrounded by the first recess, and a second pad portion, provided in the second surface of the shield case, sandwiched between the second recesses, and extending at an angle or at a right angle with respect to the first pad portion.

* * * * *